(12) United States Patent
Garshelis et al.

(10) Patent No.: US 7,437,942 B2
(45) Date of Patent: Oct. 21, 2008

(54) NON-DESTRUCTIVE EVALUATION VIA MEASUREMENT OF MAGNETIC DRAG FORCE

(75) Inventors: Ivan J. Garshelis, Dalton, MA (US); Stijn P. L. Tollens, San Diego, CA (US)

(73) Assignee: MagCanica, Inc., San Diego, CA (US)

( * ) Notice: Subject to any disclaimer, the term of this patent is extended or adjusted under 35 U.S.C. 154(b) by 0 days.

(21) Appl. No.: 11/588,983

(22) Filed: Oct. 27, 2006

(65) Prior Publication Data

US 2007/0125182 A1    Jun. 7, 2007

Related U.S. Application Data

(60) Provisional application No. 60/731,882, filed on Oct. 30, 2005.

(51) Int. Cl.
*G01B 7/16*    (2006.01)
*G01L 1/00*    (2006.01)

(52) U.S. Cl. ........................................................ 73/779
(58) Field of Classification Search ................... 73/779
See application file for complete search history.

(56) References Cited

U.S. PATENT DOCUMENTS

| | | | | | |
|---|---|---|---|---|---|
| 2,398,574 | A | * | 4/1946 | Bell | 73/54.38 |
| 2,731,025 | A | * | 1/1956 | Neuman et al. | 137/85 |
| 3,225,605 | A | * | 12/1965 | Slater | 73/503 |
| 3,513,386 | A | * | 5/1970 | Walraven | 324/164 |
| 3,517,894 | A | * | 6/1970 | Pauls | 242/419.3 |
| 3,717,103 | A | * | 2/1973 | Guderjahn | 104/285 |
| 3,863,501 | A | * | 2/1975 | Janssen et al. | 73/861.24 |
| 3,892,185 | A | * | 7/1975 | Guderjahn | 104/286 |
| 4,915,318 | A | * | 4/1990 | Morrison | 242/419 |
| 4,950,988 | A | * | 8/1990 | Garshelis | 324/207.24 |
| 5,206,469 | A | * | 4/1993 | Takeda et al. | 200/61.45 M |
| 5,367,257 | A | * | 11/1994 | Garshelis | 324/207.22 |
| 6,725,982 | B2 | * | 4/2004 | Tani et al. | 188/164 |
| 7,030,603 | B2 | * | 4/2006 | Ramarajan | 324/164 |

OTHER PUBLICATIONS

Cullity, "Introduction to Magnetic Materials," Addison-Wesley, Reading, MA, Appendix 4:614-616 (1972).
De Wulf et al., "Quasistatic measurements for hysteresis modeling," *J. Appl. Phys.*, 87(9):5239-5241 (2000).
De Wulf et al., "Comparison of methods for the determination of dc-magnetic properties of laminated SiFe alloys," *J. Appl. Phys.*, 93(10):8543-8545 (2003).

(Continued)

*Primary Examiner*—Edward Lefkowitz
*Assistant Examiner*—Octavia Davis
(74) *Attorney, Agent, or Firm*—BioTechnology Law Group; Daniel M. Chambers

(57) ABSTRACT

Sensors for outputting signals indicative of a magnetic drag force between a ferromagnetic sample that is or has been in motion relative to one or more measurement magnets are described. Such sensors include at least one measurement magnet and a sensing element operably associated therewith, such that upon or after exposure of the measurement magnet(s) to a ferromagnetic sample in motion relative thereto, the sensor can sense the drag force, if any, or changes therein, experienced by the measurement magnet. Devices for detecting and/or measuring magnetic drag force that employ one or more of these sensors are also described, as are various applications for such devices.

22 Claims, 26 Drawing Sheets

OTHER PUBLICATIONS

De Wulf et al., "Design and calibration aspects of small size single sheet testers," *J. Magn. Magn. Mat.*, 254-255:70-72 (2003).

Dupré et al., "Loss versus cutting angle in grain-oriented Fe-Si laminations," *J. Magn. Magn. Mat.*, 215-216:112-114 (2000).

* cited by examiner

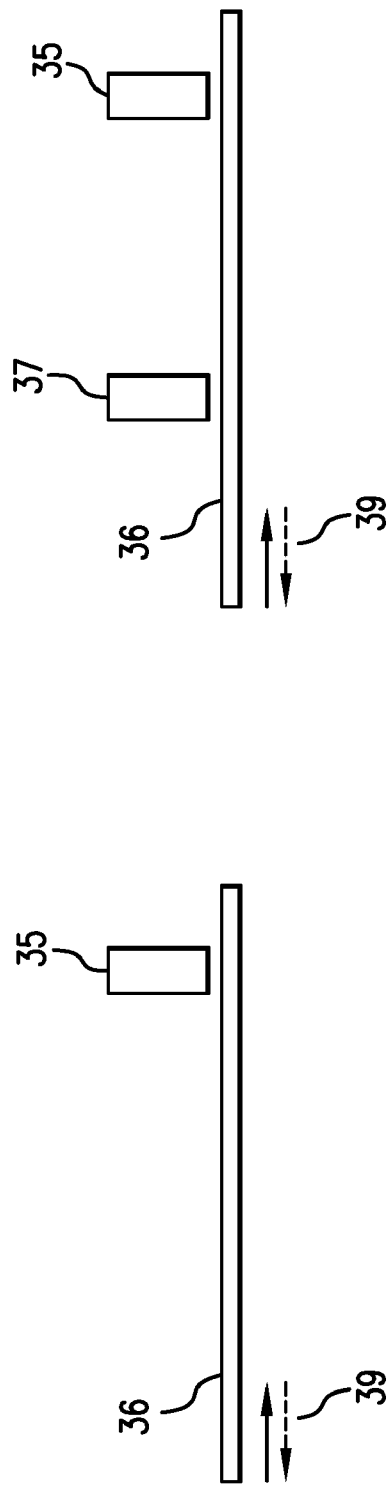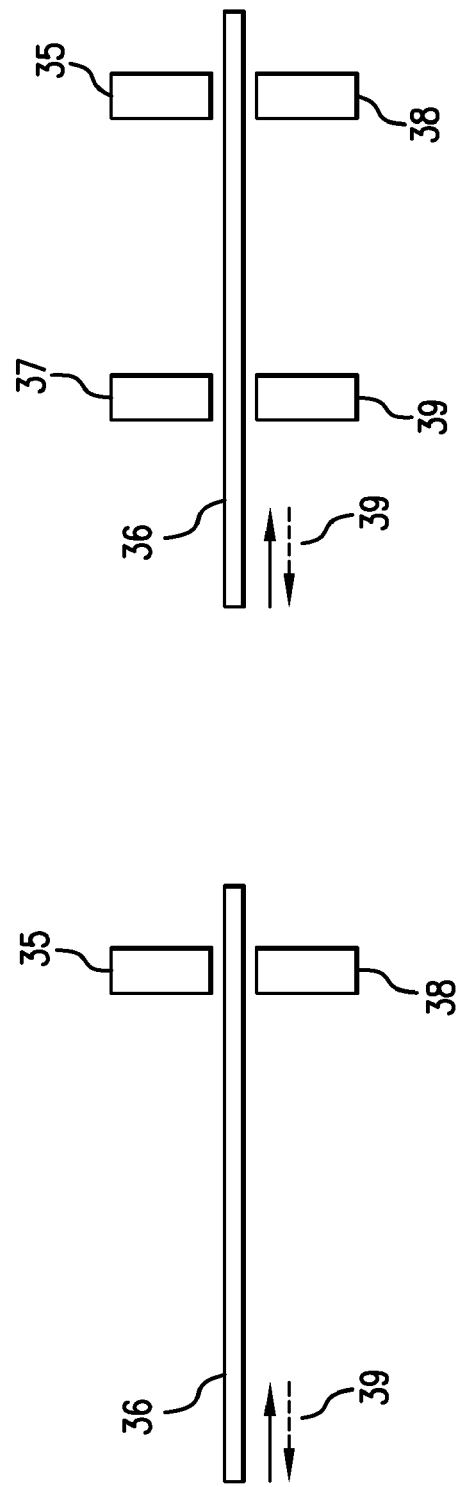

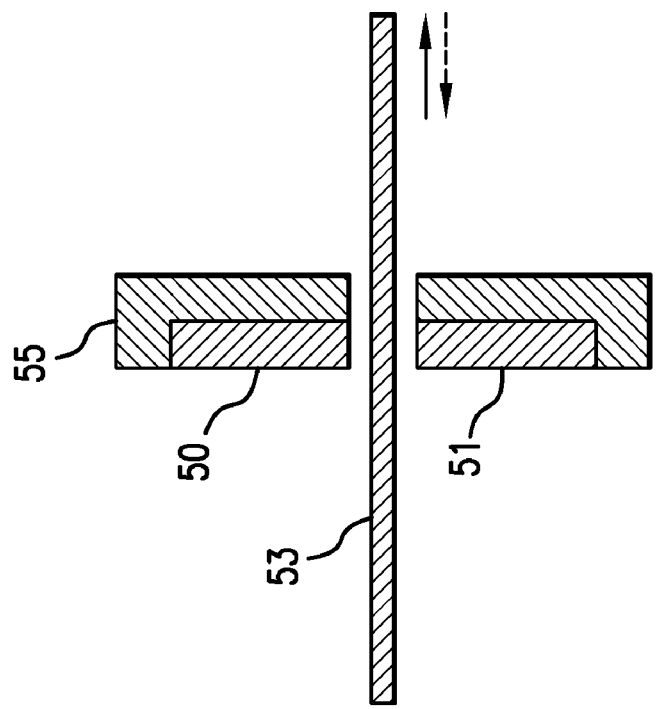
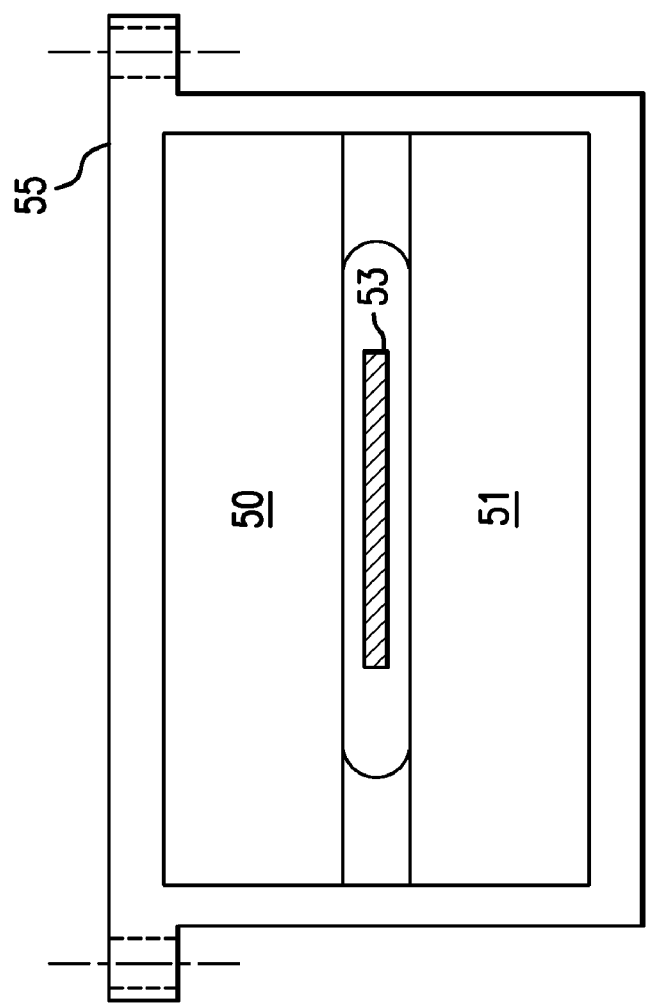
FIG. 13a

NON-DESTRUCTIVE EVALUATION VIA MEASUREMENT OF MAGNETIC DRAG FORCE

RELATED APPLICATION

This patent application claims priority to the benefit of U.S. Provisional Patent Application Ser. No. 60/731,882, filed 31 Oct. 2005, which application is hereby incorporated by reference for all purposes.

TECHNICAL FIELD

This invention concerns sensors and devices suited to non-destructively evaluate ferromagnetic samples. The sensors used in these devices sense the magnetic drag force between a sample and one or more measurement or reference magnets.

BACKGROUND OF THE INVENTION

1. Introduction

The following description includes information that may be useful in understanding the present invention. It is not an admission that any such information is prior art, or relevant, to the presently claimed inventions, or that any publication specifically or implicitly referenced is prior art.

2. Background

Ferromagnetic materials are a predominant or essential constituent of most of the structures and machines built and utilized throughout the modern industrial world. By far, most of the tonnage of the steels and other iron alloys used in these applications is ferromagnetic. Many alloys of nickel and/or cobalt, as well as alloys of such rare earth elements as gadolinium, terbium, dysprosium, and samarium, are also ferromagnetic. Ferromagnetic structural steels provide unmatched strength-to-cost ratios, and the magnetic flux conduction capabilities of electrical steels and related ferromagnetic materials are essential to the efficient operation of the electrical machines that generate, use, or transform electricity. Whether selected for particular mechanical or magnetic characteristics, it is important that one or more relevant properties of the material be known to meet or exceed the specified or expected value. To this end, a wide range of evaluation techniques has been developed. Of special interest are methods where the evaluation can be performed on the actual product, rather than on a surrogate sample, ostensibly, but not assuredly, having sufficiently identical values of the measured properties to those possessed by the actual product. The practice of many simple testing techniques results in the sample being destroyed, marred, or otherwise made unusable, or less usable, for its original purpose. Thus, much effort has been expended in the development of non-destructive evaluation (NDE) techniques, wherein the actual properties of interest, or other properties that unwaveringly correlate with the properties of interest, can be measured on the actual product.

While the quality of the finished product, in regards to the measured quantity, can be ascertained by one or more already available techniques, it would be even more useful if the property of interest could be ascertained in the material from which the product is subsequently fabricated while at some stage in its processing where actions to improve the property of interest can still be taken. For example, detection of scratches, dents, or other unacceptable surface markings on sheet steels destined to be used for refrigerator door panels or the like, caused, for example, by rubbing against an out of place guide during a rolling operation, would be better made at the rolling mill than during or after fabrication of the door panel. Undesirable variations in properties depending on controlled heat treatments, or quenching conditions of materials produced in continuous form, such as sheet, strip, wire, cable, ribbon, and the like, are clearly best found early in the process where corrective measures may be instituted before the variations reach unacceptable limits and to minimize wastage.

Several currently practiced methods of non-destructive evaluation are based on magnetic phenomena, typically associated with the detection of leakage flux arising from locally inhomogeneous magnetization as might occur across cracks or similar flaws at or near the surface of the part being tested. One of the most generally practiced of these methods requires coating of the part to be inspected with fluorescent dyes mixed with fine magnetic particles. Successful use of the method requires skilled personnel trained to both use the equipment and interpret the results. In a related method, leakage flux is detected by Hall effect or magnetoresistive field sensors in conjunction with permanent or electromagnets. These types of field sensors respond to magnetic fields within highly localized regions of space, hence a plurality of such sensors is required to inspect the full width of a strip or other product having dimensions significantly larger than the sensing range of the test probe. Alternatively, large regions must be inspected by repeated scanning in raster like fashion, a process adding significantly to inspection time and cost.

Electrical steels are often characterized by their magnetic hysteresis loss, since this property is a major determinant of the energy and size efficiency of the transformer, motor, or other device in which the steel is used. Usual methods for measuring these losses involve clamping a sample strip to the pole surfaces of a magnetizing yoke, electrically excited by currents from a computer controlled power supply. The process is both time consuming and requires relatively sophisticated apparatus.

Clearly there remains a need in the art for alternative NDE technologies, and it is the object of this invention to address this need.

3. Definitions.

Before describing the instant invention in detail, several terms used in the context of the present invention will be defined. In addition to these terms, others are defined elsewhere in the specification, as necessary. Unless otherwise expressly defined herein, terms of art used in this specification will have their art-recognized meanings.

An "array" refers to an organized grouping of two or more similar or identical components. For example, an "array of measurement magnets" or "measure magnet array" refers to an array that includes a plurality of measurement magnets. These magnets may be arrays in any desired configuration, including segmented arrays (such that the longitudinal axes of the magnets are on the same line), staggered arrays (i.e., the longitudinal axes of some of the magnets are on lines that differ from those formed by the axes of other of the magnets), and segmented, staggered arrays.

An "electromagnet" is a piece of wire intended to generate a magnetic field by the passage of electric current through it. Typically, the wire is coiled or wound, and an electromagnet is preferably constructed in such a way as to maximize the strength of the magnetic field it produces upon passage of an electric current through the wire. On the other hand, a "permanent" magnet refers to a magnet made of a material (e.g., an NdFeB alloy) that maintains a magnetic field with no external help.

A "ferromagnetic" material is one that readily magnetizes in the presence of an external magnetic field.

The terms "measure", "measuring", "measurement" and the like refer not only to quantitative measurement of a particular variable, for example, magnetic drag force, but also to qualitative and semi-quantitative measurements. Accordingly, "measurement" also includes detection, meaning that merely detecting a change, without quantification, constitutes measurement.

A "patentable" process, machine, or article of manufacture according to the invention means that the subject matter satisfies all statutory requirements for patentability at the time the analysis is performed. For example, with regard to novelty, non-obviousness, or the like, if later investigation reveals that one or more claims encompass one or more embodiments that would negate novelty, non-obviousness, etc., the claim (s), being limited by definition to "patentable" embodiments, specifically exclude the unpatentable embodiment(s). Also, the claims appended hereto are to be interpreted both to provide the broadest reasonable scope, as well as to preserve their validity. Furthermore, if one or more of the statutory requirements for patentability are amended or if the standards change for assessing whether a particular statutory requirement for patentability is satisfied from the time this application is filed or issues as a patent to a time the validity of one or more of the appended claims is questioned, the claims are to be interpreted in a way that (1) preserves their validity and (2) provides the broadest reasonable interpretation under the circumstances.

The term "operably associated" refers to an operable association between two or more components. For example, a measurement magnet is "operably associated" with a sensing element when it is possible for the sensing element to sense the application of a force applied to the measurement magnet.

A "plurality" means more than one.

SUMMARY OF THE INVENTION

One object of this invention is to provide sensors and devices that rely on the drag force between at least one external magnet, usually a reference magnet or a measurement magnet, and a ferromagnetic sample. Another object is to provide methods of making and using such sensors and devices, for example, in various applications, including the determination of magnetic hysteresis loss, to detect and/or determine the presence, size, and/or location of local inhomogeneities in the structure, composition, and/or dimensions of ferromagnetic parts or members, and to detect purposefully instilled patterns of inhomogeneities as markers or signatures in order to identify a specific item, its orientation, or location.

Thus, one aspect of the invention concerns sensors capable of responding to a magnetic drag force. In general, such a sensor employs at least one measurement magnet and an operably associated sensing element (e.g., a load cell). Any suitable electromagnet or permanent magnet can be used as a measurement magnet, with magnets that produce consistent, uniform magnetic fields of known strength being preferred. Similarly, any suitable sensing element can be used. In general, any such sensing element will detect, or "sense", a force applied to the measurement magnet and output a signal indicative of that force. In particular, the sensing element can detect application of a magnetic drag force to the measurement magnet (or an array of measurement magnets) upon exposure to a ferromagnetic sample in relative motion to the measurement magnet (or measurement magnet array) and output a signal indicative of that force. Preferred sensing elements include those that sense physical displacement of a measurement magnet in response to a magnetic drag force, those that sense the force experienced by the measurement magnet in response to a magnetic drag force. Typically, the sensing element will employ one or more load cells, capacitive force transducers, force-sensing resistors, magnetoelastic force sensors, or torsional balances to sense the force applied to the measurement magnet. Preferred load cells include those that comprise a strain gauge, piezoelectric crystals, or a hydraulic or pneumatic load cell.

A closely related aspect of the invention concerns devices that employ one or more sensors according to the invention, i.e., magnetic drag force measurement devices. In general, such devices include at least one magnetic drag force sensor positioned such that, in operation, the measurement magnet will be proximately spaced from a ferromagnetic sample capable of moving relative to the measurement magnet. Thus, the sensor, the sample, or both may be moved in relation to the other during operation of the device. Signals output by the sensor are preferably conditioned by any suitable electronic circuitry and then recorded or analyzed. In preferred embodiments, the signals are digitized into a form suitable for use by a processor configured to process them in order to determine a parameter of the magnetic drag force experienced by the measurement magnet. The results of the processing may be stored in a storage device and/or output to an output device (for example, a plotter, a computer monitor).

In order to move the magnetic drag force sensor and/or the ferromagnetic sample, a device according to the invention preferably includes a drive system adapted for the particular application. Moreover, for some applications (e.g., measurement of hysteresis loss), it is desirable to sufficiently magnetize the sample, preferably by placing it in a state of known remnant magnetization, prior to moving the sample relative to the magnetic drag force sensor. This may be accomplished through the use of one or more magnets positioned upstream of the measurement magnet(s) of the magnetic drag force sensor. Alternatively, the sample may first be exposed to the measurement magnet in a non-sensing mode in order to establish the desired state of remnant magnetization. Thereafter, the sample can be moved relative to the magnetic drag force sensor so that the drag force can be measured. It will also be appreciated that a magnetic drag force may also be detected after stopping the relative motion of the magnetic drag force sensor and sample.

In addition, or alternatively, a device of the invention may also include one or more magnets, including one or more measurement magnets associated with one or more magnetic drag force sensors, positioned such that upon exposure to a sample, at least one measurement magnet is proximately spaced from a first surface of the sample and a second measurement magnet is proximately spaced from a second, different surface of the sample. For example, in a device wherein the sample horizontally moves through the device, one measurement magnet is positioned above and is proximately spaced from the upper surface of the sample, whereas the other measurement magnet is positioned below and is proximately spaced from the lower surface of the sample.

A device according to the invention can be adapted for detecting and/or measuring (qualitatively, semi-quantitatively, or quantitatively) magnetic drag forces in conjunction with ferromagnetic samples of any shape, size, or composition. Representative sample shapes include plates, bars, strips, wires, and cables. In cross-section, such samples may, for example, have a geometric shape selected from the group consisting of a circle, an ovoid shape, and a polygon (e.g., a triangle, rectangle, square, etc.). In many embodiments, the device will be configured to analyze ferromagnetic samples of substantially uniform geometric cross-section, while in other embodiments, the devices will be configured to adapt to different sample sizes, shapes, etc. Samples may be separate pieces, or they may be one continuous piece.

Another related aspect of the invention concerns methods of using the sensors and devices of the invention. In general terms, such methods involve moving a ferromagnetic sample relative to a magnetic drag force measurement device and measuring the magnetic drag force experienced by the measurement magnet of the magnetic drag force sensor as a result of the relative movement between the ferromagnetic sample and the measurement magnet. Preferred applications for such methods include measurement of hysteresis losses, sample hardness and/or thickness, and material composition and/or microstructure, and detection of inhomogeneity or other defects (e.g., internal flaws, surface scratches, etc.) in the sample. Other applications include determining a material's orientation, position, and/or identity or source (for example, by detecting a coded arrangement of non-visible features).

Each of these general applications (e.g., determining magnetic hysteresis loss, detection of local inhomogeneities, detection of purposefully instilled patterns of such inhomogeneities as markers or signatures, detection of the location of an inhomogeneity within a sample, determining which portion of a sample is being analyzed, etc.) has a variety of specific applications. In many of these, drag force measurement often offers benefits over other approaches intended to accomplish the same end. For example, measurement of hysteresis loss in strip samples of electrical steels (standard size strips, commonly called "Epstein strips" after the name of the apparatus in which the hystersis losses of such strips are commonly measured) by drag force measurement requires less time, utilizes smaller and more economical apparatus, and can be used to simultaneously detect local inhomogeneites. It also allows real time measurement of hysteresis losses during the manufacture of such materials. In actuality, there are at least two sources of drag force. One of these is based on the asymmetrical magnetization that arises within a (homogeneous) sample that is moving, or has been moved, through the intense field close to a properly oriented permanent magnet. This asymmetry arises because of magnetic hysteresis in the sample material. Another source of drag force is the appearance of local magnetic "poles" within the sample at the extreme of local inhomogeneities. The presence of these poles (resulting from local inhomogeneity) can be sensed by the forces they exert on the "poles" of the measurement magnet. In most cases, a ferromagnetic material will have both hysteresis and be imperfectly homogenous and therefore show both a finite steady state drag force and a superimposed drag force that varies with position of the material relative to the measurement magnet.

Yet another aspect of the invention relates to magnetic drag force measurement devices for measuring magnetic drag force not using a sensor having sensing element operably associated with a measurement magnet, but with a sample stage. In this way, drag force on the sample is measured. Here, the sensing element outputs signals indicative of a magnetic drag force experienced by the ferromagnetic sample upon exposure to a pre-determined magnetic field generated by a reference magnet (or reference magnet array) spaced from and in motion relative to the ferromagnetic sample. In preferred embodiments, additional electronics are associated with the sensor so that the signals may be processed, analyzed, and used to generate a meaningful output. In such devices, a drive may be used to move the proximately spaced reference magnet across some or all of one or more surfaces of the sample. In operation, a magnetic drag force is typically measured by moving a proximately spaced reference magnet (or reference magnet array) that provides a magnetic field of pre-determined strength in relation to a magnetic drag force measurement device having a ferromagnetic sample positioned on the sample stage, wherein the sample stage is operably associated with one or more force sensing elements.

Other features and advantages of the invention will be apparent from the following drawings, detailed description, and appended claims.

BRIEF DESCRIPTION OF THE FIGURES

This application contains at least one figure executed in color. Copies of this application with color drawing(s) will be provided upon request and payment of the necessary fee.

FIG. 11 has four panels, a-d. Each panel shows a strip (36) capable of being driven in opposite directions (indicated by arrows 39) by a drive mechanism (not shown). Panel (a)

Figure 1:
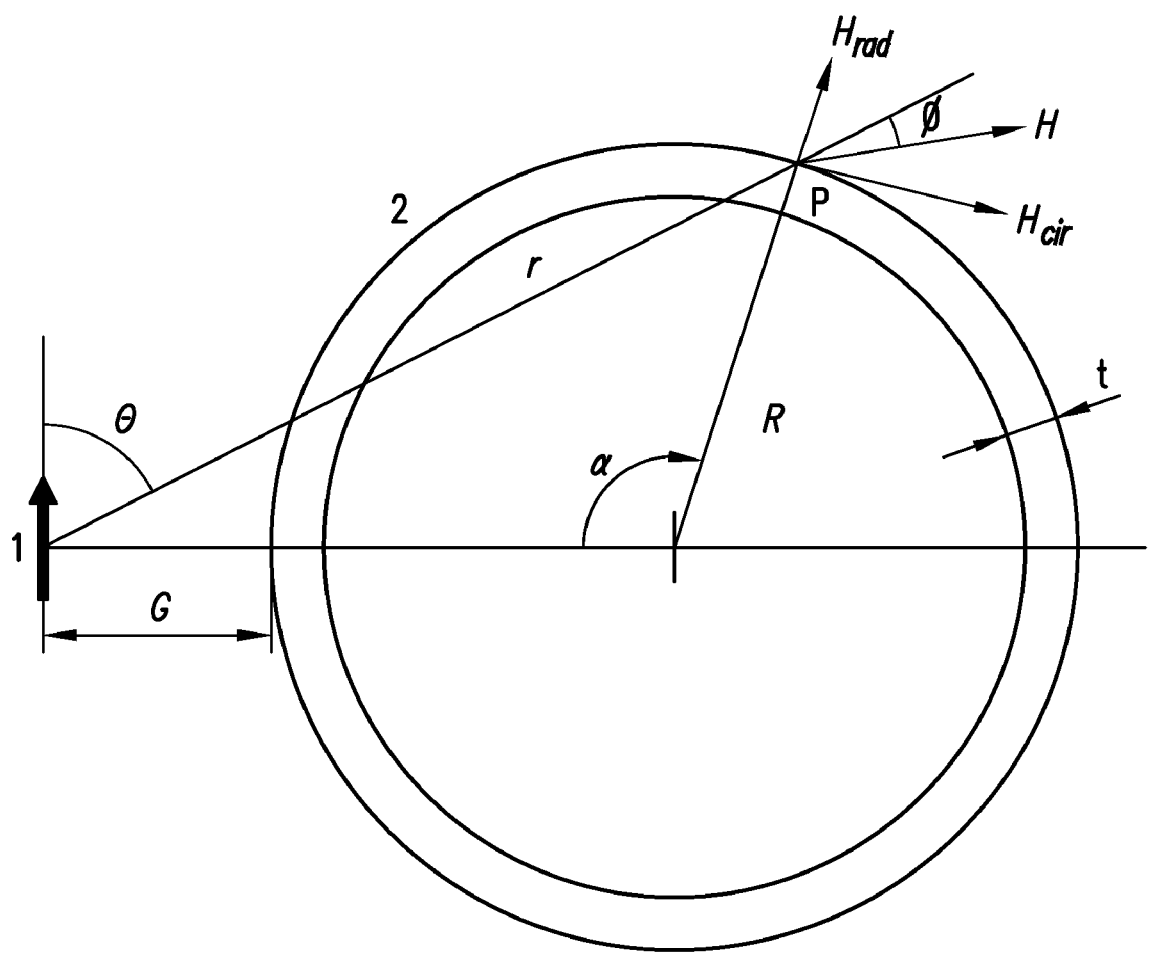
FIG. 1 illustrates the physical arrangement of a polarizing magnet used to create a band having circumferential remnant magnetization in a ferromagnetic shaft that is rotated about its longitudinal axis.

illustrates a strip (36) positioned for analysis by a device of the invention that employs one measurement magnet (35). Panel (b) shows an embodiment having two magnets, a measurement magnet (35) and an initialization magnet (37). Panel (c) shows an illustration of a device according to the invention that has two measurement magnets (35 and 38) disposed on opposite sides of the strip (36). In panel (d), a device having two initialization magnets (37 and 39) and two measurement magnets (35 and 38) is shown. As will be appreciated, an initialization magnet may also be referred to as an "upstream" magnet, in that it is positioned upstream of the measurement magnet when the sample under test ("SUT", here, a strip (36)) is moved in one direction, such as in the illustrations in this Figure, from left to right.

Figure 12A:
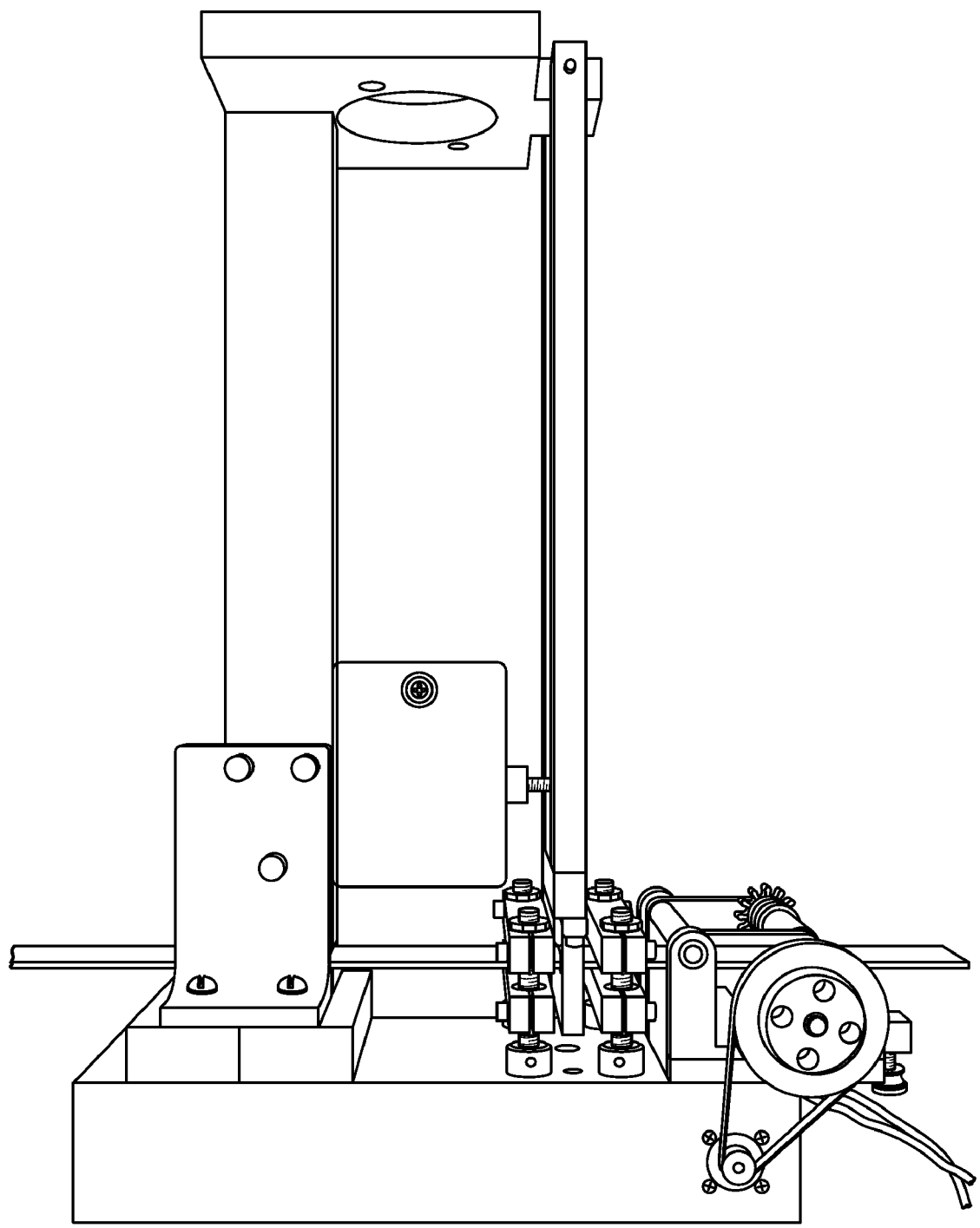
Figure 12B:
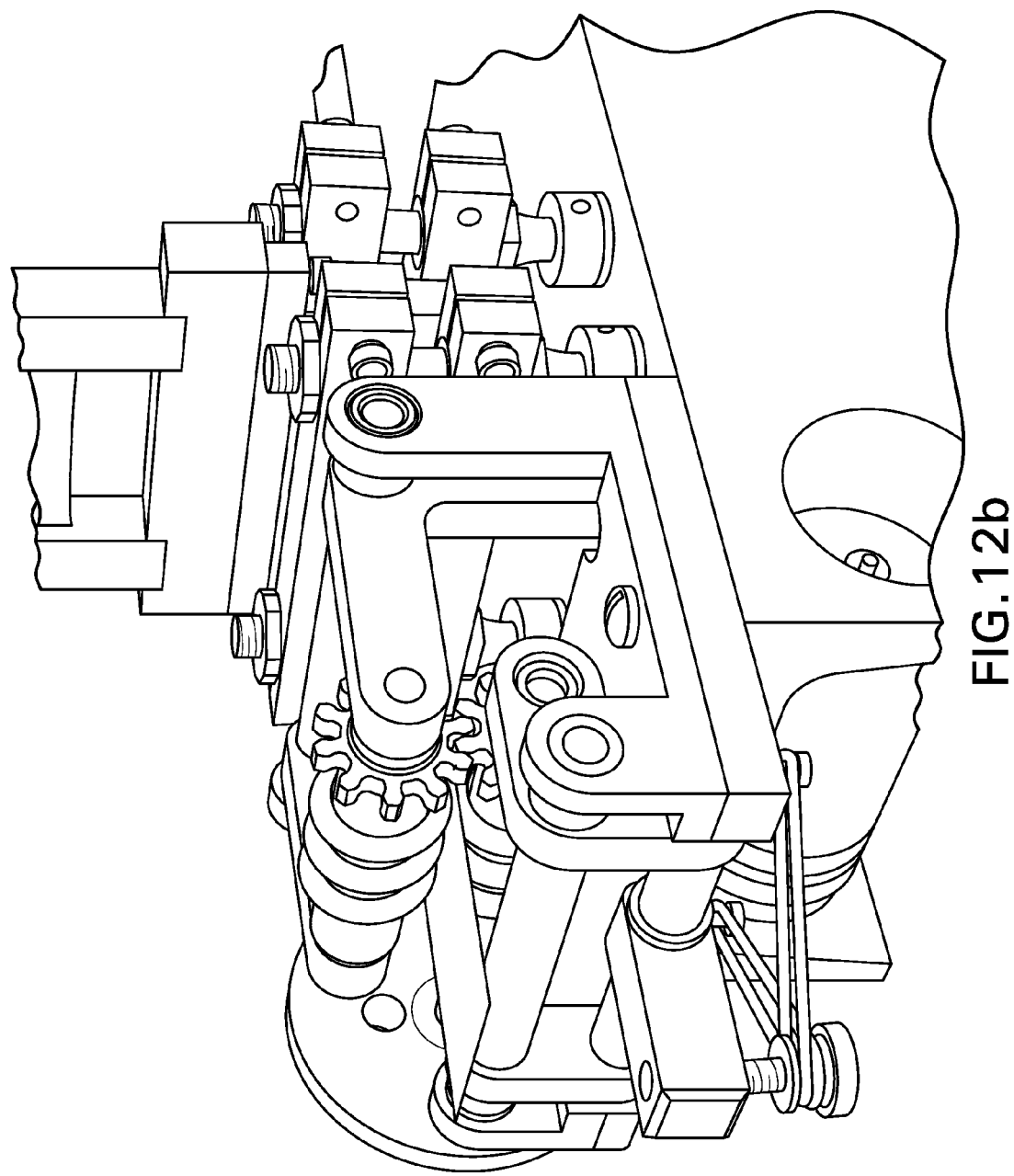

FIG. 12 contains two photographs ((a) and (b) of a preferred magnetic drag force measurement device according to the invention. The photograph in FIG. 12(a) shows a side view of the device, whereas the photograph in FIG. 12(b) provides a detailed view of the device's drive mechanism. In this embodiment, the drag force sensor employs two measurement magnets, one positioned above the sample, the other below the sample. The magnets are held in position by a magnet holder.

FIG. 13 has two panels, (a) and (b). Panel (a) contains two illustrations. One shows a front view of the magnet holder (55), which in this embodiment, holds two measurement magnets (50 and 51) each positioned about a slot through which strip (53) can be moved. In this embodiment, each of the measurement magnets extends beyond the slot through which suitably sized strips may be inserted. Advantageously, such an arrangement provides for more uniform magnetic fields across the width of a strip as it is driven through the device. Panel (b) shows a side view of an embodiment of a device according to the invention having one measurement magnet.

Figure 14:
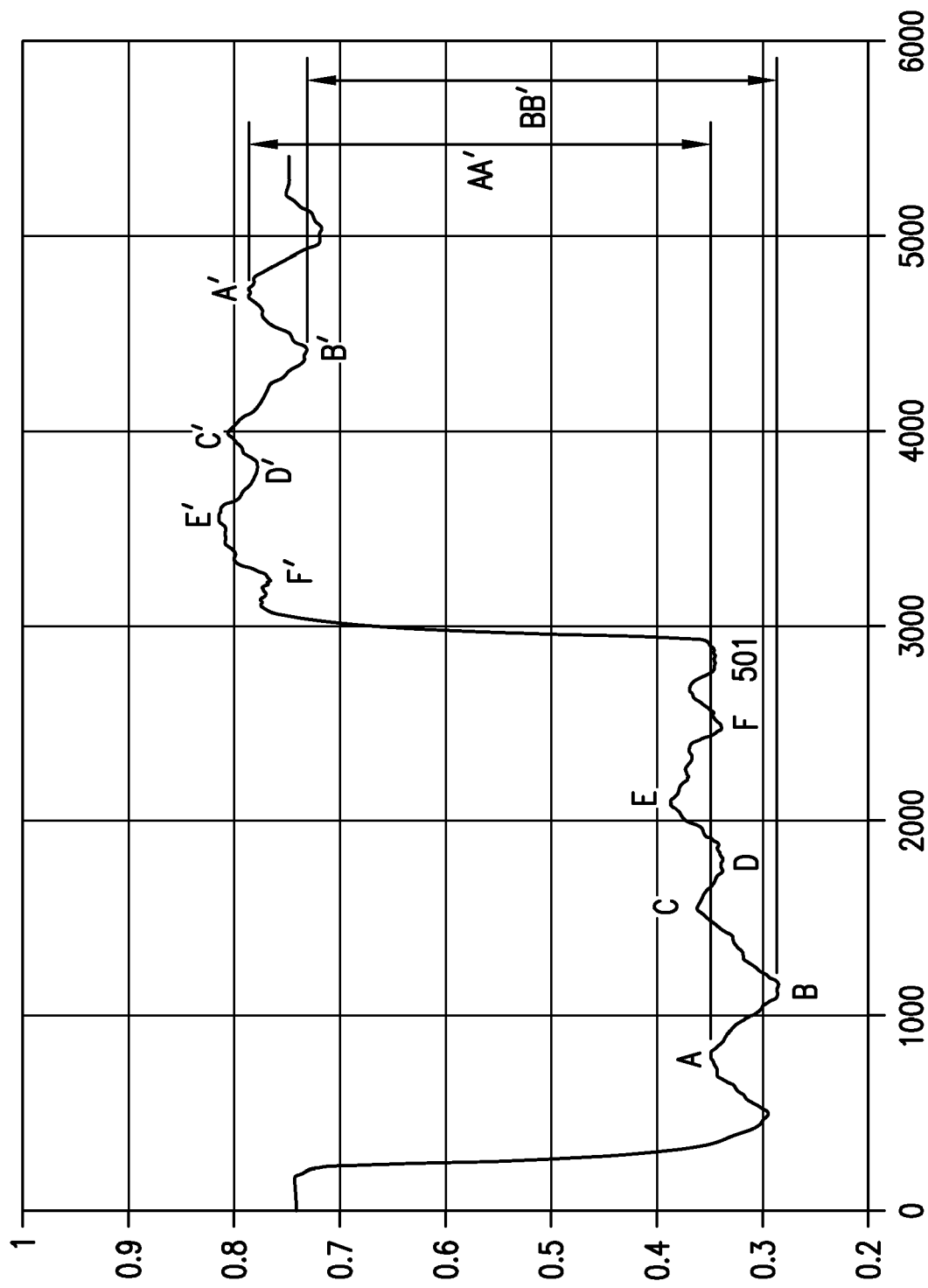

FIG. 14 shows an actual plot of load cell output versus time (position) for a strip evaluated as described in Example 3.

Figure 15:
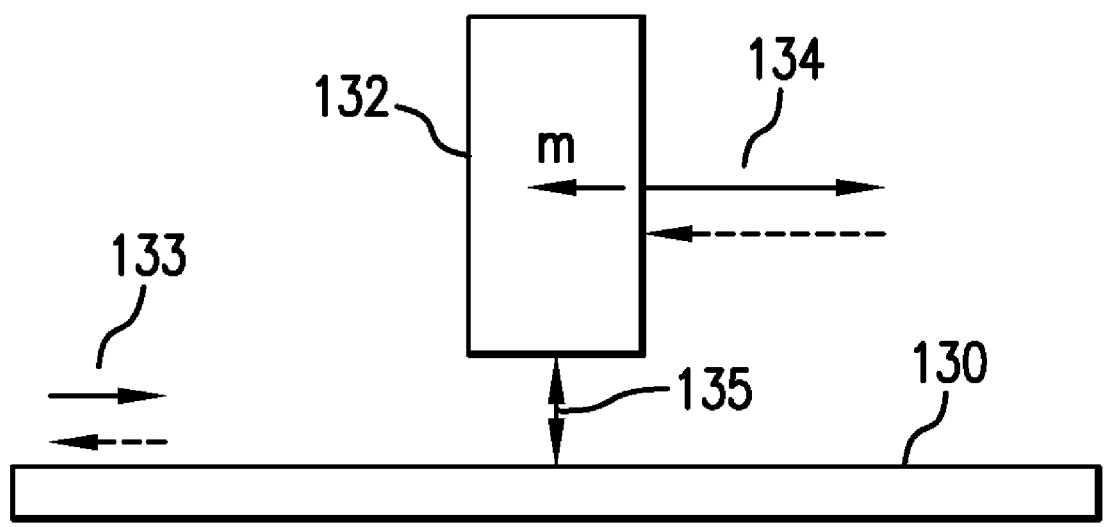

FIG. 15 shows a schematic arrangement of a strip (130) and a measurement magnet (132) in a drag force measurement device. In this Figure, "m" designates the magnetic moment of the measurement magnet (132) positioned a distance (135) from the strip (130). 134 represents drag forces that may be experienced by the measurement magnet (132). 133 represents the motion of the strip (130) in the device.

FIGS. 16 (a), (b), (c), (d), (e), and (f) plot results from theoretical modeling described in Example 3. All parameters, except normalized distance x, are normalized against their maximum values.

Figure 17:
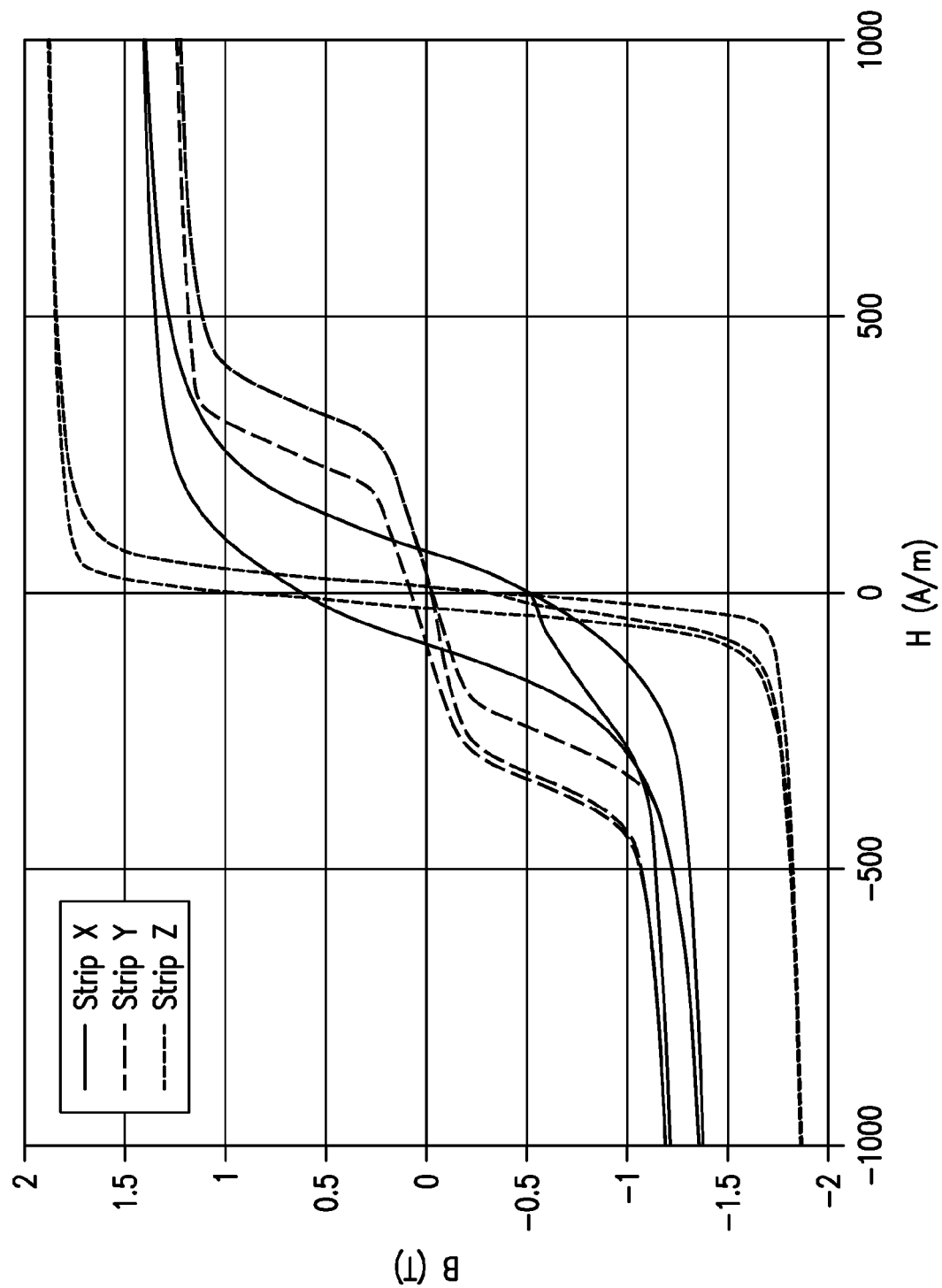

FIG. 17 plots the hysteresis loops for the materials indicated (Example 3 describes the experiments that gave rise to this data), with the peak applied field being ±10 kA/m.

Figure 18:
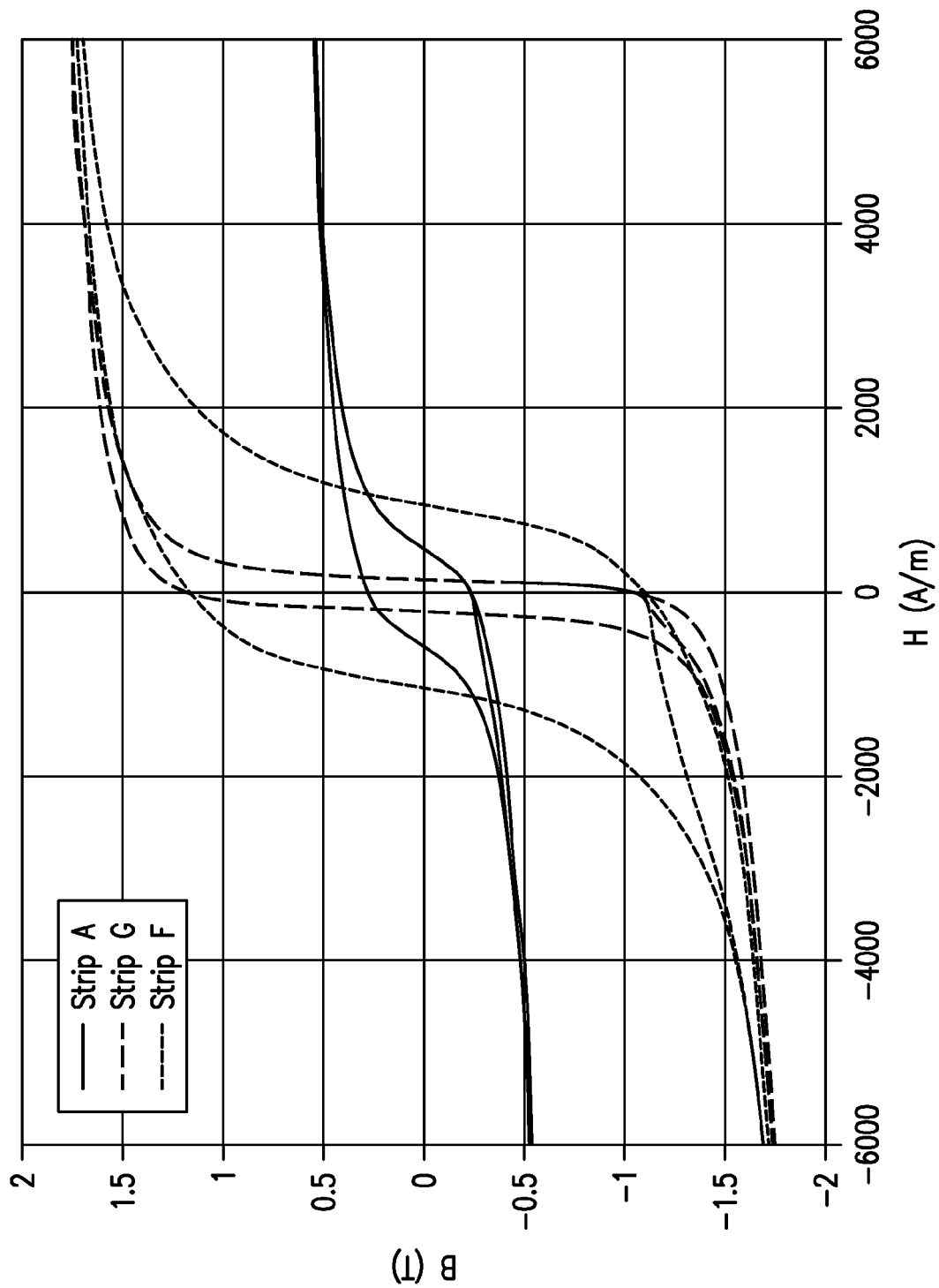

FIG. 18 plots the hysteresis loops for the materials indicated (Example 3 describes the experiments that gave rise to this data), with the peak applied field being ±10 kA/m.

Figure 19:
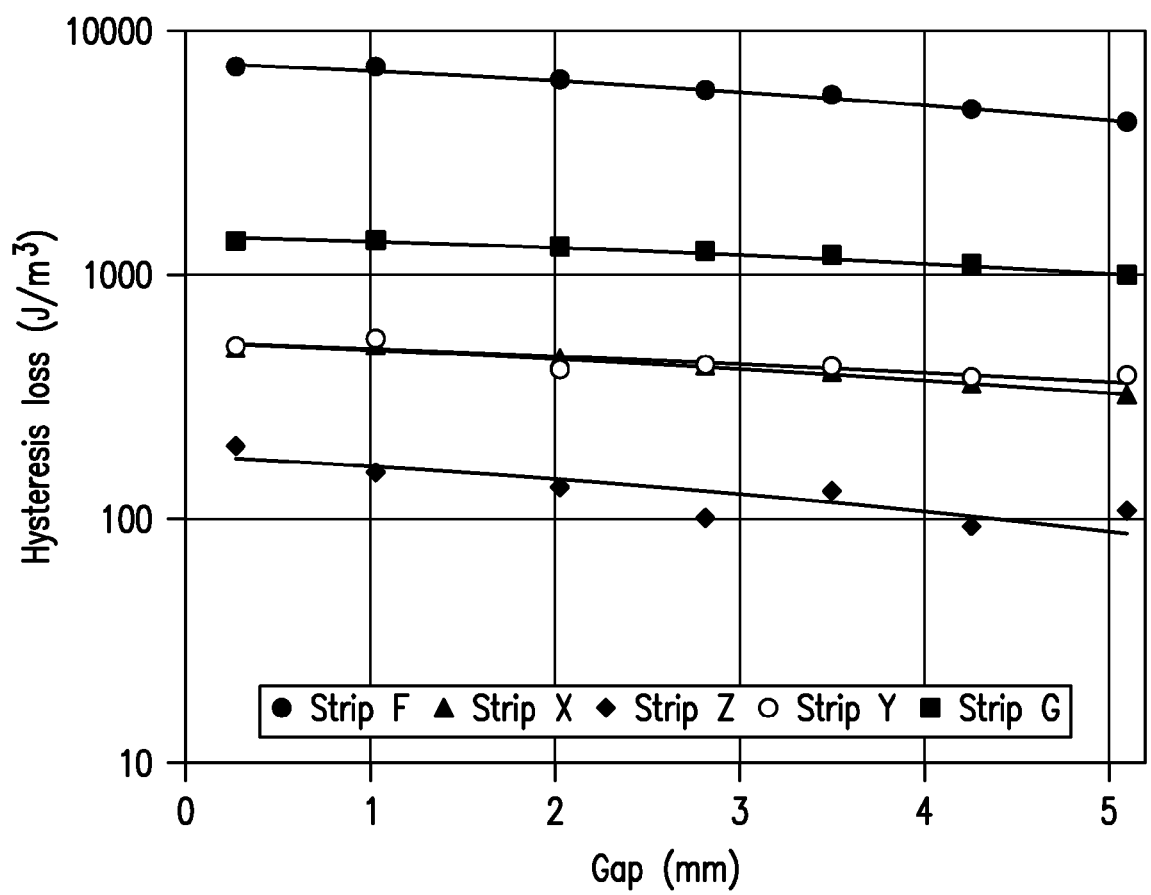

FIG. 19 plots the effect of gap between a measurement magnet and a sample strip on measured drag forces, as measured using a device as described in Example 3.

Figure 20:
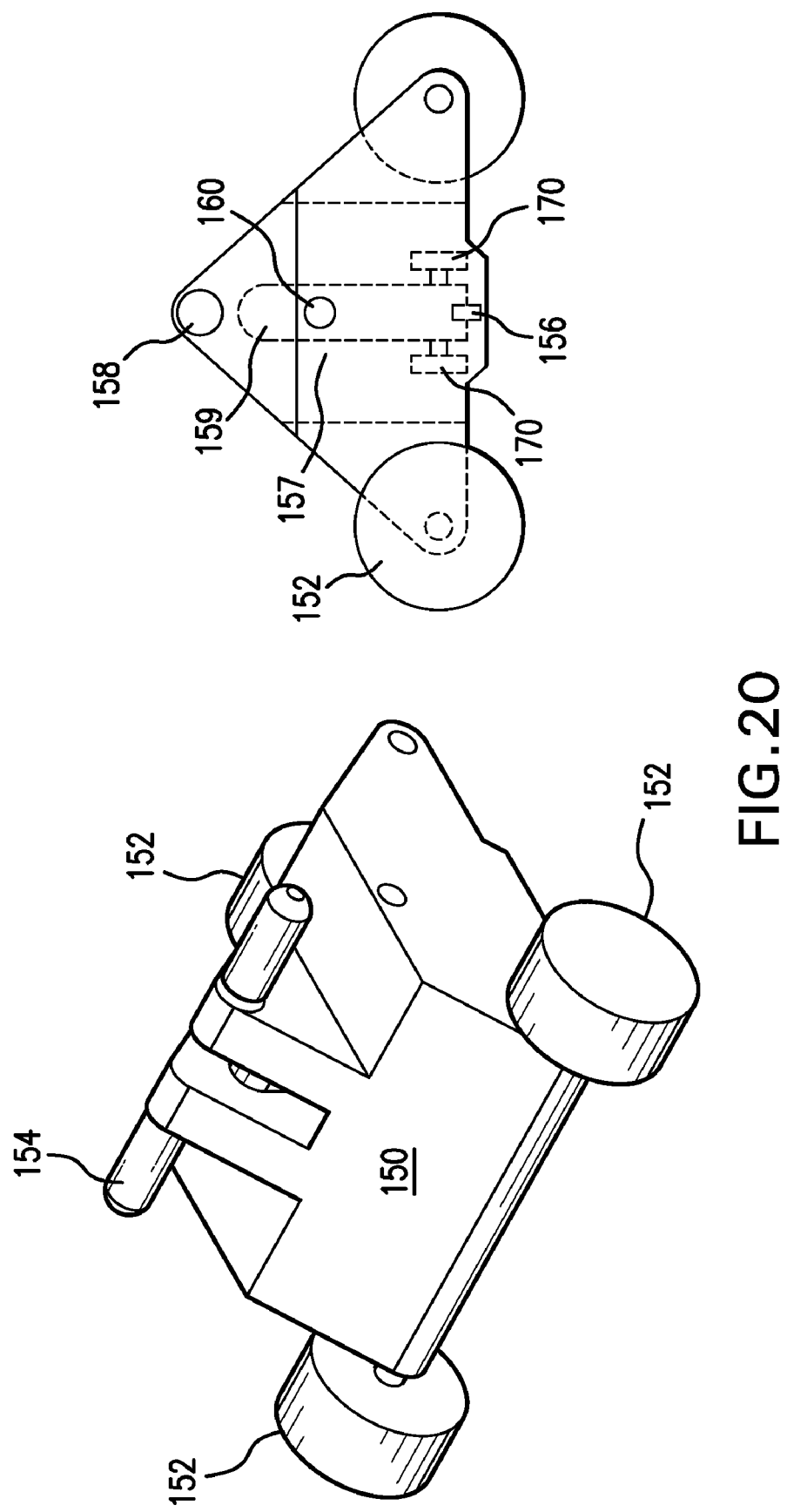

FIG. 20 shows two cartoon views of a portable magnetic drag force-sensing device according to the invention.

Figure 21:
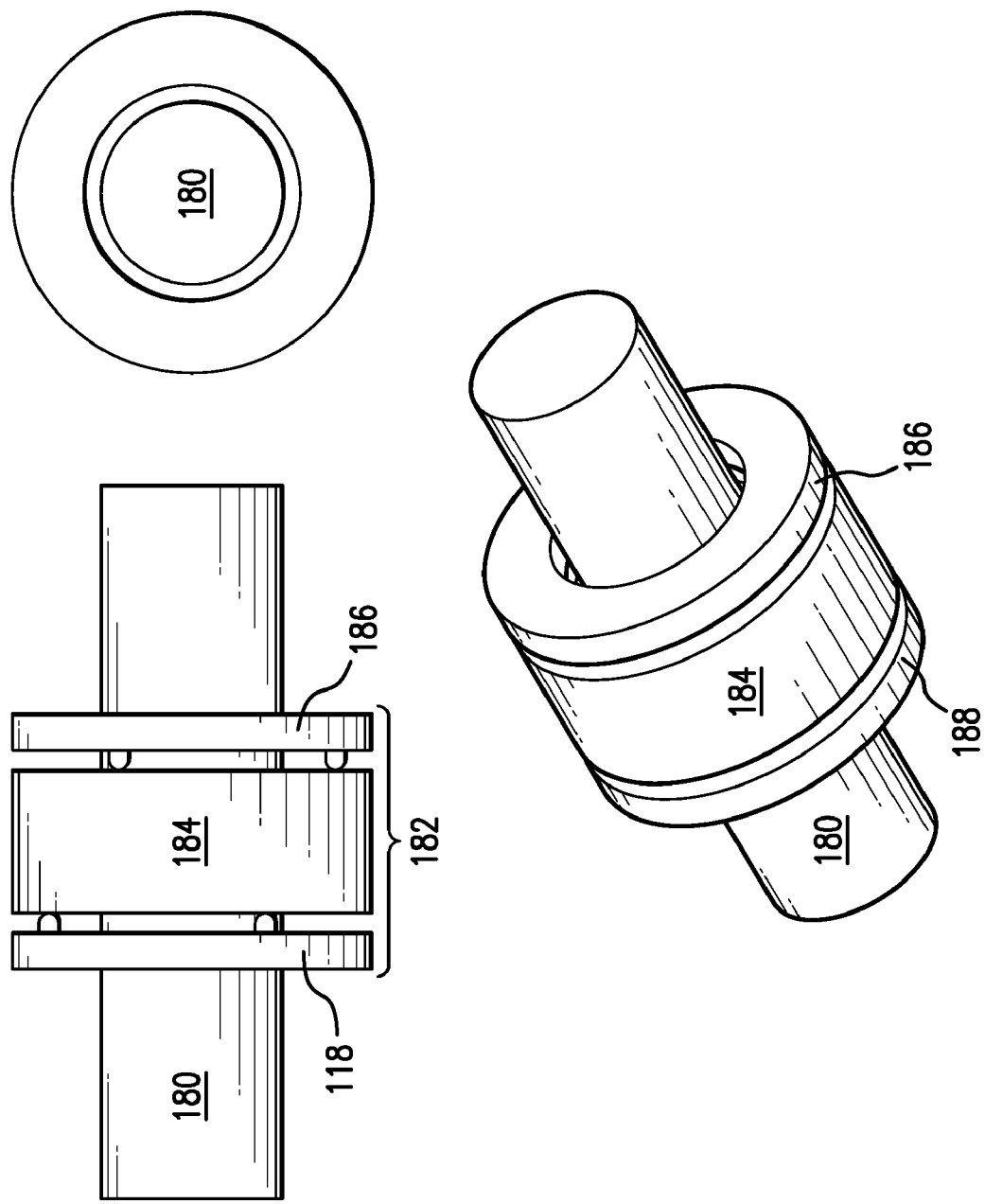

FIG. 21 shows three views of a magnetic drag force-sensing device to detect flaws in cables.

Figure 22:
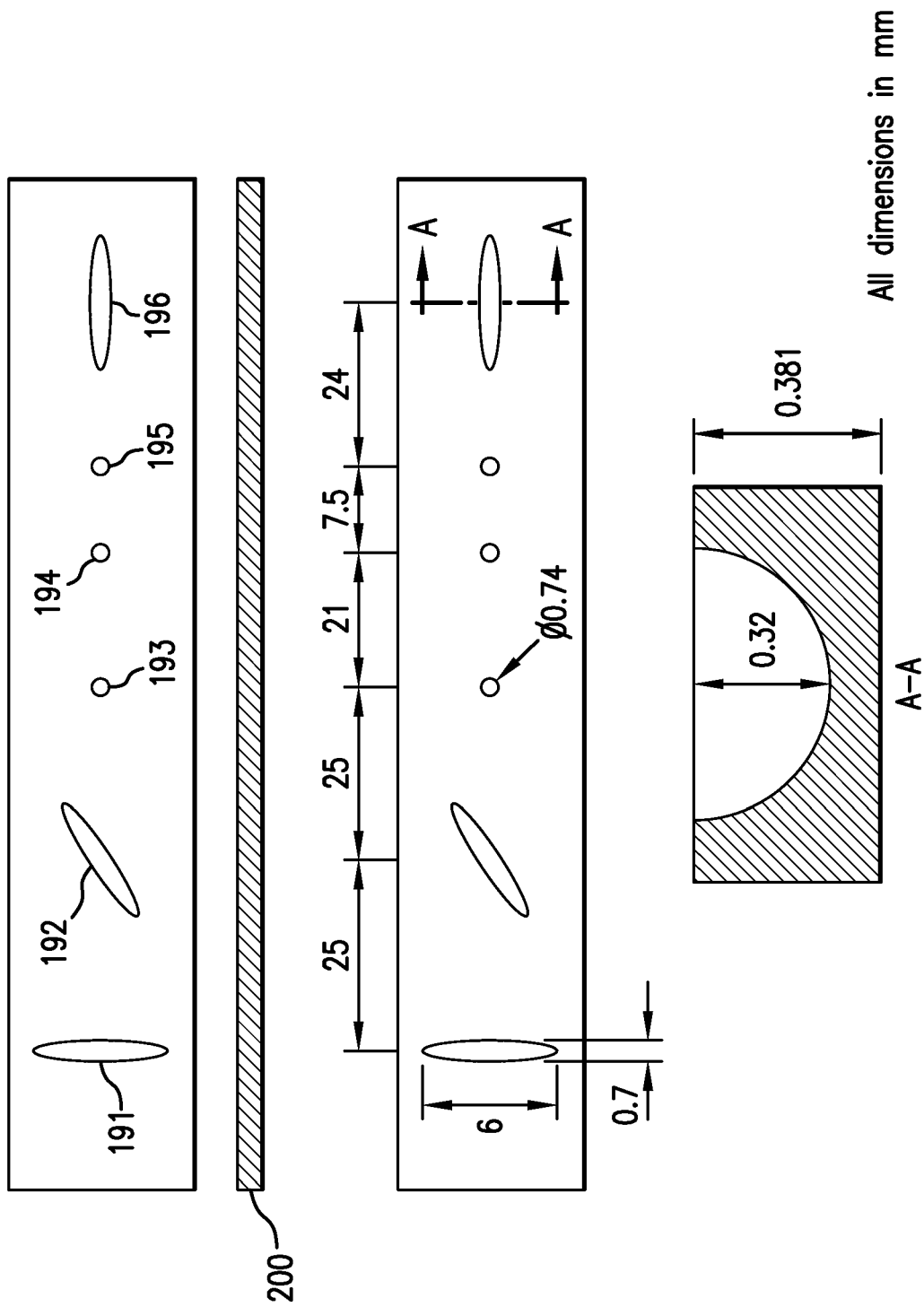

FIG. 22 shows a strip of low carbon steel in which various "defects" were purposefully instilled at various locations.

Figure 23:
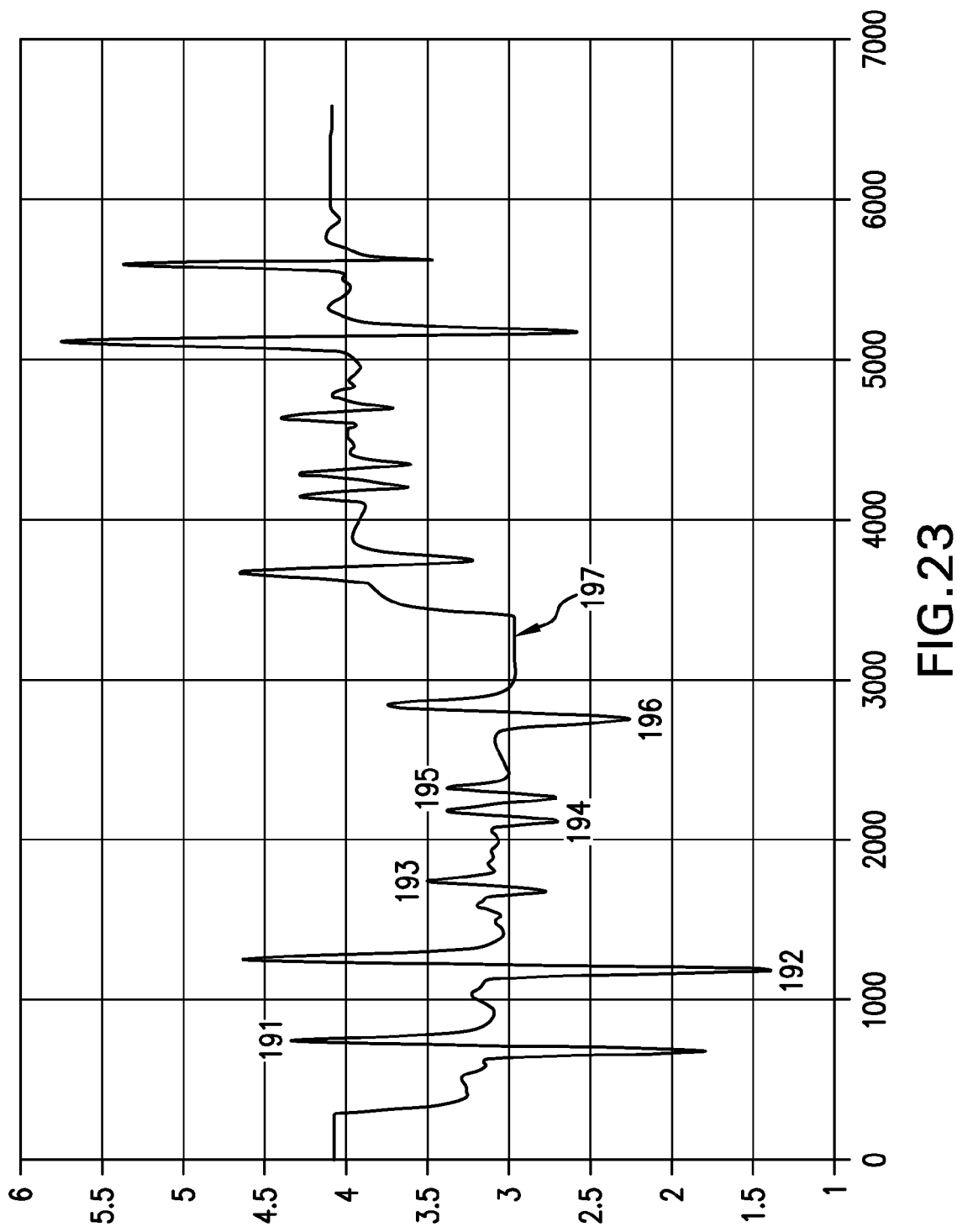

FIG. 23 shows a plot of drag force against time generated by moving the strip of FIG. 22 in an apparatus according to the invention, first by moving the strip in one direction, and then, after a small pause, in the reverse direction.

Figure 24:
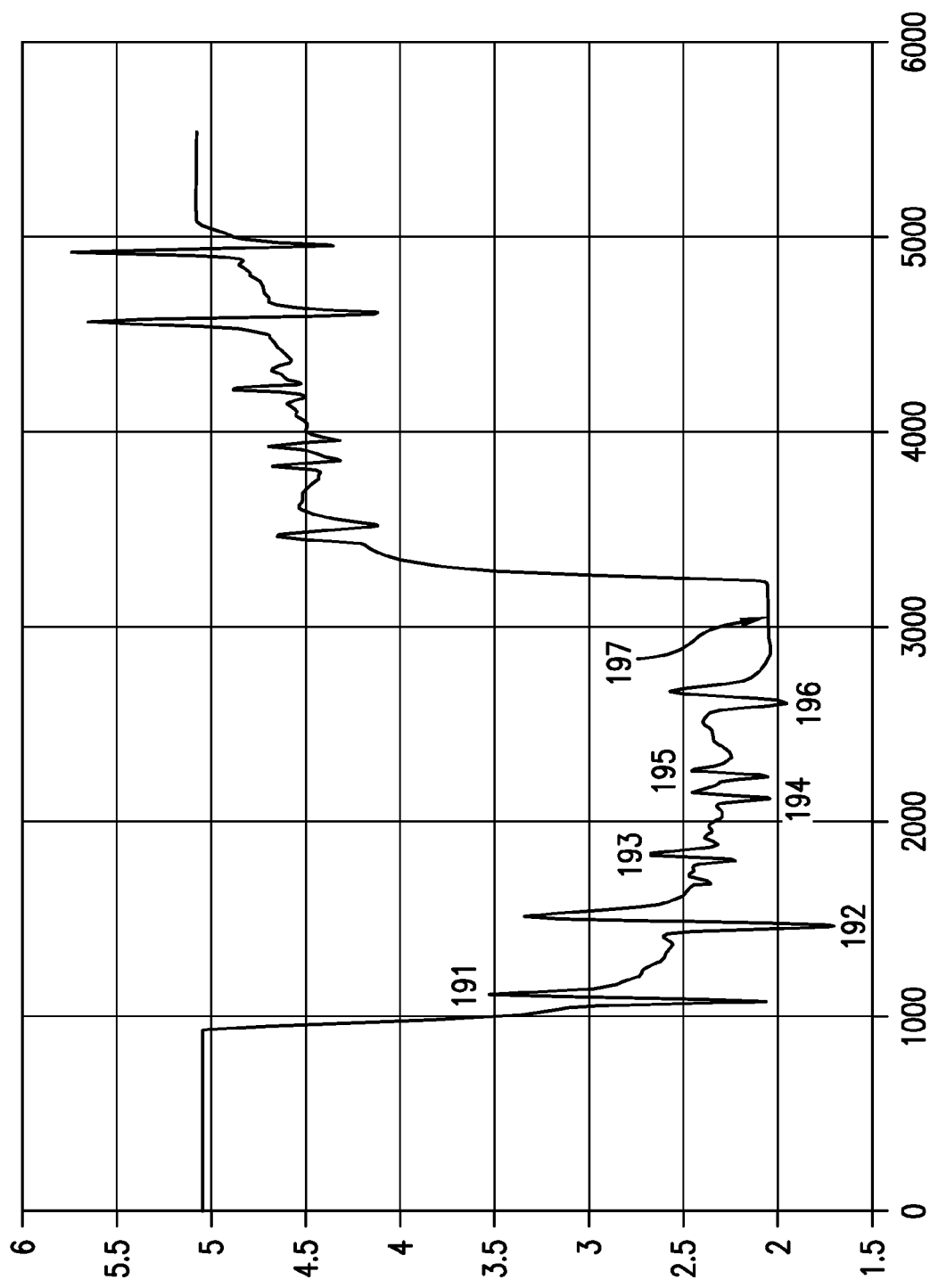

FIG. 24 shows a drag force plot for a "stack" of three strips all having the same nominal length and width dimensions and cut from the same sheet of material, in which the "middle" strip had purposefully instilled "defects".

As those in the art will appreciate, the following detailed description describes certain preferred embodiments of the invention in detail, and is thus only representative and does not depict the actual scope of the invention. Before describing the present invention in detail, it is understood that the invention is not limited to the particular aspects and embodiments described, as these may vary. It is also to be understood that the terminology used herein is for the purpose of describing particular embodiments only, and is not intended to limit the scope of the invention defined by the appended claims.

DETAILED DESCRIPTION

1. Introduction.

This invention is based on the surprising discovery that the drag torque experienced during the process of magnetizing one or more polarized circumferential bands on a ferromagnetic shaft diminishes from its starting value during some number of shaft revolutions in close proximity to a (circumferentially) thin magnet. Magnetization of a polarized band on the shaft is determined to be complete when the drag torque stabilizes.

Without wishing to be bound to any particular theory, the following description represents what is believed to be the basis for this discovery. FIG. 1 shows the physical arrangement used to magnetically polarize a circumferential band of width w and depth ρ on a ferromagnetic shaft (2) together with pertinent geometric factors. "R" represents the outside radius of the shaft, "G" the gap between magnet (1) and shaft, "r" the distance between any point "P" on the periphery of the shaft and the magnet center, and "α", the position angle for any point P measured in the CW direction starting from the magnet side. Values for "r", "φ", and "θ" can be calculated according to the following formulas:

$$r = [(R+G)^2 + R^2 - 2(R+G)R \cos \alpha]^{1/2} \quad (1)$$

$$\phi = \tan^{-1}(0.5 \tan \theta) \quad (2)$$

$$\theta = \pi/2 - \sin^{-1}(R \sin \alpha / r) \quad (3)$$

Although a real polarizing magnet comprises a 3-dimensional distribution of magnetic dipoles, it can be represented as a single equivalent dipole of magnetic moment m. Thus, the intensity of the field H at any point P on the periphery of the shaft in the plane of m can be determined using the formula:

$$H = \frac{m}{r^3}(3\cos^2\theta + 1)^{1/2}, \quad (4)$$

Since H is directed at angle φ to r, where $\phi = \tan^{-1} 0.5 \tan \theta$, it will have both circumferential and radial components, as follows:

$$H_{cir} = H \cos(\alpha - \theta - \phi)$$

$$H_{rad} = H \sin(\alpha - \theta - \phi) \quad (5)$$

Figure 2:
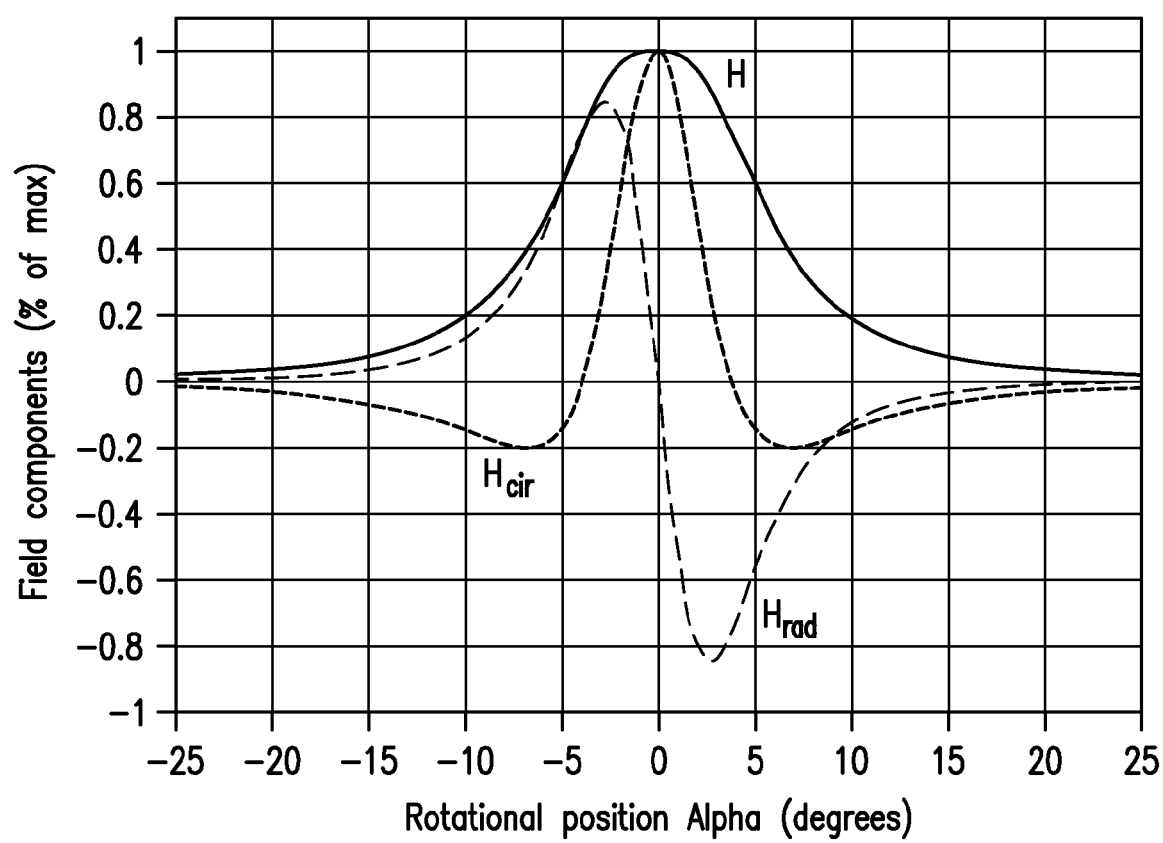
FIG. 2 shows the variation of H, $H_{cir}$, and $H_{rad}$ as defined in FIG. 1, on the periphery of a cylindrical ferromagnetic shaft as a function of position angle $\alpha$. All values are normalized against the maximum value of H, and they all continue to diminish for values of $\alpha$ beyond the plot edges.

FIG. 2 shows the variations of H, $H_{cir}$, and $H_{rad}$ with α for the arbitrarily chosen gap, G=0.1 R. The manner in which the field intensity and its direction vary are more clearly understood from a study of the plot shown in FIG. 3. Analogous curves for other values of G/R have similar shapes, although the range of α where the visible portions of the curve reside diminishes with decreasing G/R. In those regions of the shaft close to a strong polarizing magnet, the absolute intensity of H will exceed the coercive force, $H_c$, of the shaft material. The dashed circle in FIG. 3 indicates such a condition.

Figure 3:
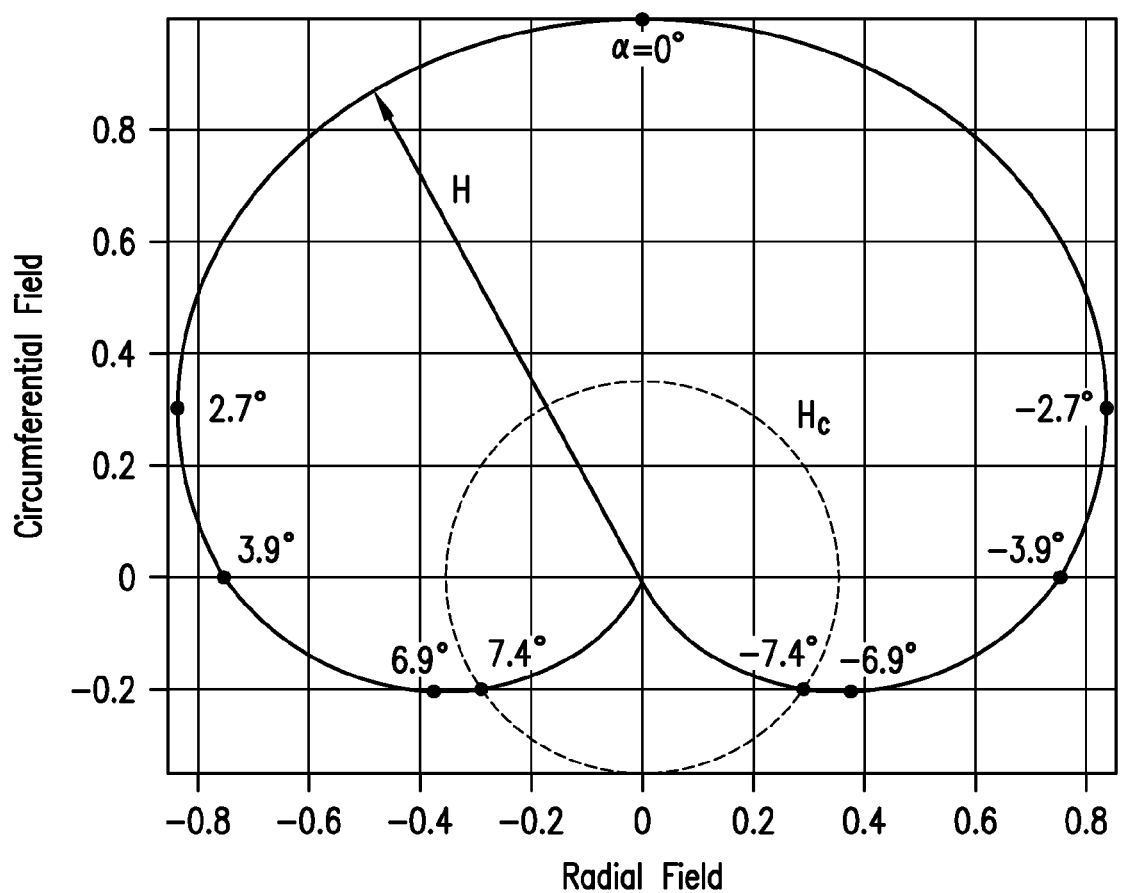
FIG. 3 shows the variation in intensity, orientation, and polarity of the magnetic field at the shaft surface within the narrow range of position angles indicated. The length and angular orientation of any line from the origin to the curve represents the relative magnitude of H and its direction relative to the actual radial and circumferential directions. The circle indicates the relative (isotropic) coercive force, $H_c$, of the shaft material.
Figure 4B:
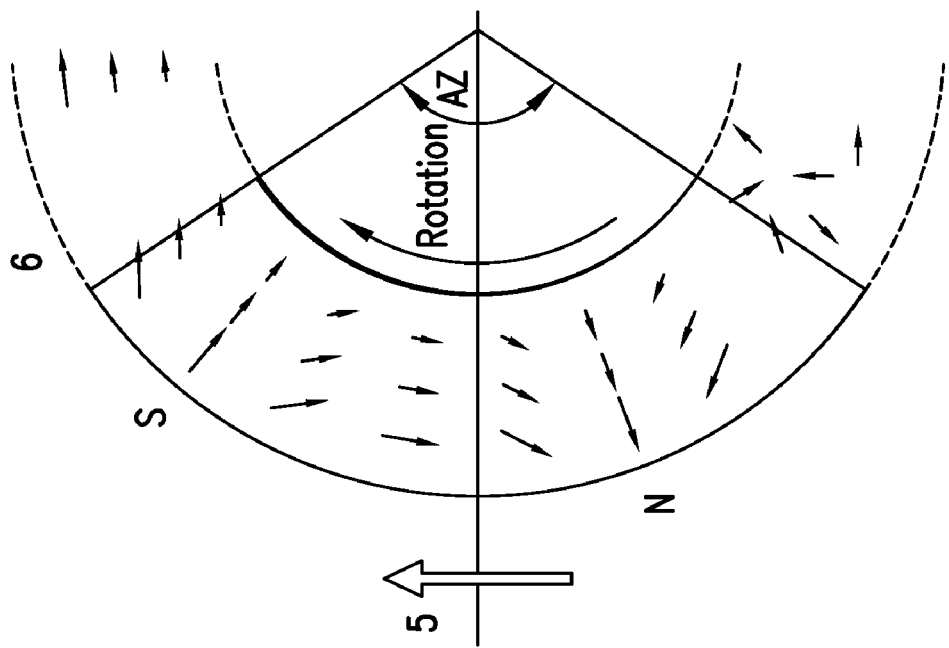
FIG. 4 shows two schematic representations of the distribution of magnetization intensity (M) and direction within the active zone of magnetization (represented as the shaded area in panels (a) and (b)) where $H>H_c$. Panel (a) shows the symmetrical distribution after the magnet has been brought to its final position by radial movement towards the shaft. Panel (b) shows the asymmetry in the distribution after the shaft starts to rotate, manifesting the need to develop sufficient magnetostatic energy before M will rotate towards H. M, in the radial direction, is reduced by the relatively large demagnetizing factor in that direction (indicated by the relatively short arrows).
Figure 4A:
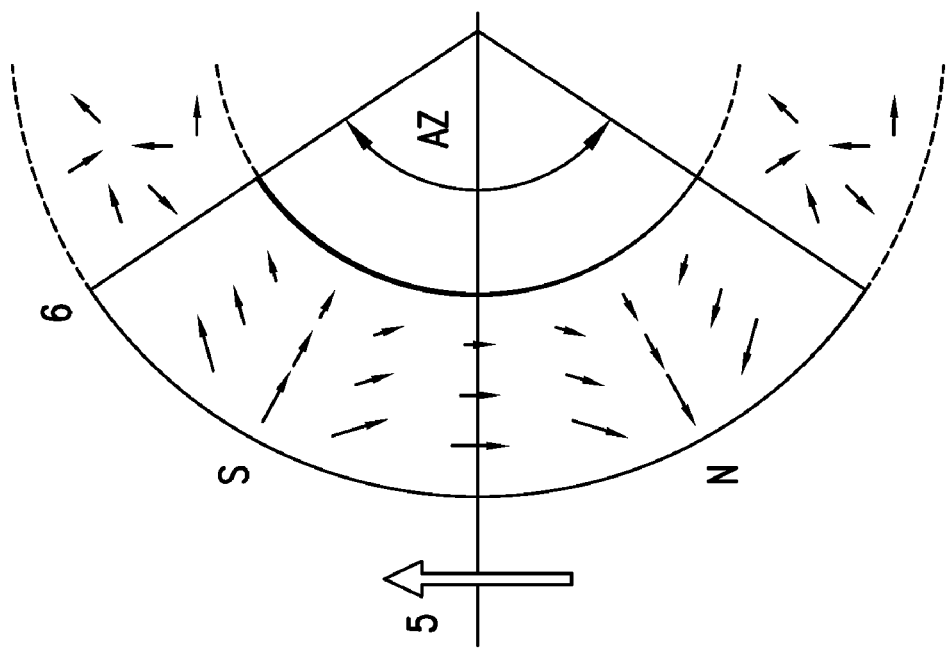

In those regions outside the circle shown in FIG. 3, but within the curve, the local intensity and direction of magnetization are determined (more so for the circumferential component, less so for the radial component due to its large demagnetization factor) by these field characteristics, as indicated schematically in FIG. 4(a). If the shaft slowly rotates, e.g., to the position shown in FIG. 4(b), the local magnetization at points within the shaft near the surface will change continuously during passage through this active zone (AZ). H may well (as in FIG. 3) remain above $H_c$ throughout a direction change of at least 180°, and even 240° or more, while passing through the AZ. Despite never reaching 360°, nor is H constant, which are the characterizing conditions for "rotational hysteresis", the same types of irreversible magnetization altering processes occur during passage through the AZ. While H and M are changing in direction, and may not always be colinear, a hysteresis loss, $E_h = \int H \bullet dM$, is induced within affected portions of the shaft.

During a complete revolution of the shaft, all portions of the shaft within the band of axial width w (determined by the corresponding magnet dimension) and to some penetration depth, p, inward from the surface of the shaft facing the magnet (determined by $H/H_c$) pass through the AZ. Since $H/H_c$ diminishes with increasing G, and as the effective gap grows with p, $E_h$ will vary with p according to the formula $E_h = f(p)$. As $H/H_c$ diminishes with increasing p, so too will $E_h$, especially as $H/H_c \rightarrow 1$, and clearly more precipitously after H drops below $H_c$. During each shaft revolution there is then a hysteretic energy, $W_h$, that must be dissipated within the shaft. The magnitude of this energy can be calculated using the formula:

$$W_h = w 2\pi \int_0 E_h(R-p) dp. \quad (6)$$

This hysteretic energy is supplied by the mechanical work expended during each revolution: $W_m = 2\pi T$, where T is the torque required to rotate the shaft. T is produced by the tangential component of force, F=T/R, originating from the magnetostatic interaction between the magnet and the "poles" associated with the asymmetrical $\nabla \bullet M$ within the AZ. Equating $W_h$ and $W_m$ and replacing T by FR yields the equation:

$$2\pi FR = w 2\pi \int_0 E_h(R-p) p \, dp. \quad (7)$$

An upper limit for F, $F_{max}$, may be found by considering that the magnet is sufficiently strong for H>>$H_c$ to a depth $p \geq t$. Under these conditions $E_h$ will reach a saturation value, $(E_h)_{sat}$, throughout the shaft cross section. If t<<R, equation (7) has the simple solution:

$$F_{max} = wt(E_h)_{sat}. \quad (8)$$

The maximum drag force is seen to depend on just two dimensions in addition to $(E_h)_{sat}$: w, determined by the magnet, and t, determined by the shaft construction. A fair estimate for $(E_h)_{sat}$ is simply the rectangular area in the B-H loop bounded by $H_c$ and $B_r$ (the retentivity of the shaft material), viz., $(E_h)_{sat} = 2H_c 2B_r/4\pi = H_c B_r/\pi$.

It is instructive to estimate the order of magnitude of the drag force expected under practical conditions. For example, in a quenched and tempered alloy steel shaft containing about 95% iron by weight, $H_c \approx 40$, Oe and $B_r \approx 10$ kG, for which $(E_h)_{sat} = 127,000$ ergs/cm$^3$, or 12,700 J/m$^3$, when w=1 cm, t=0.1 cm, and $F_{max} = 0.127$ N. The drag torque associated with hysteretic losses has long been exploited in a variety of commercial "braking" devices.

Figure 6:
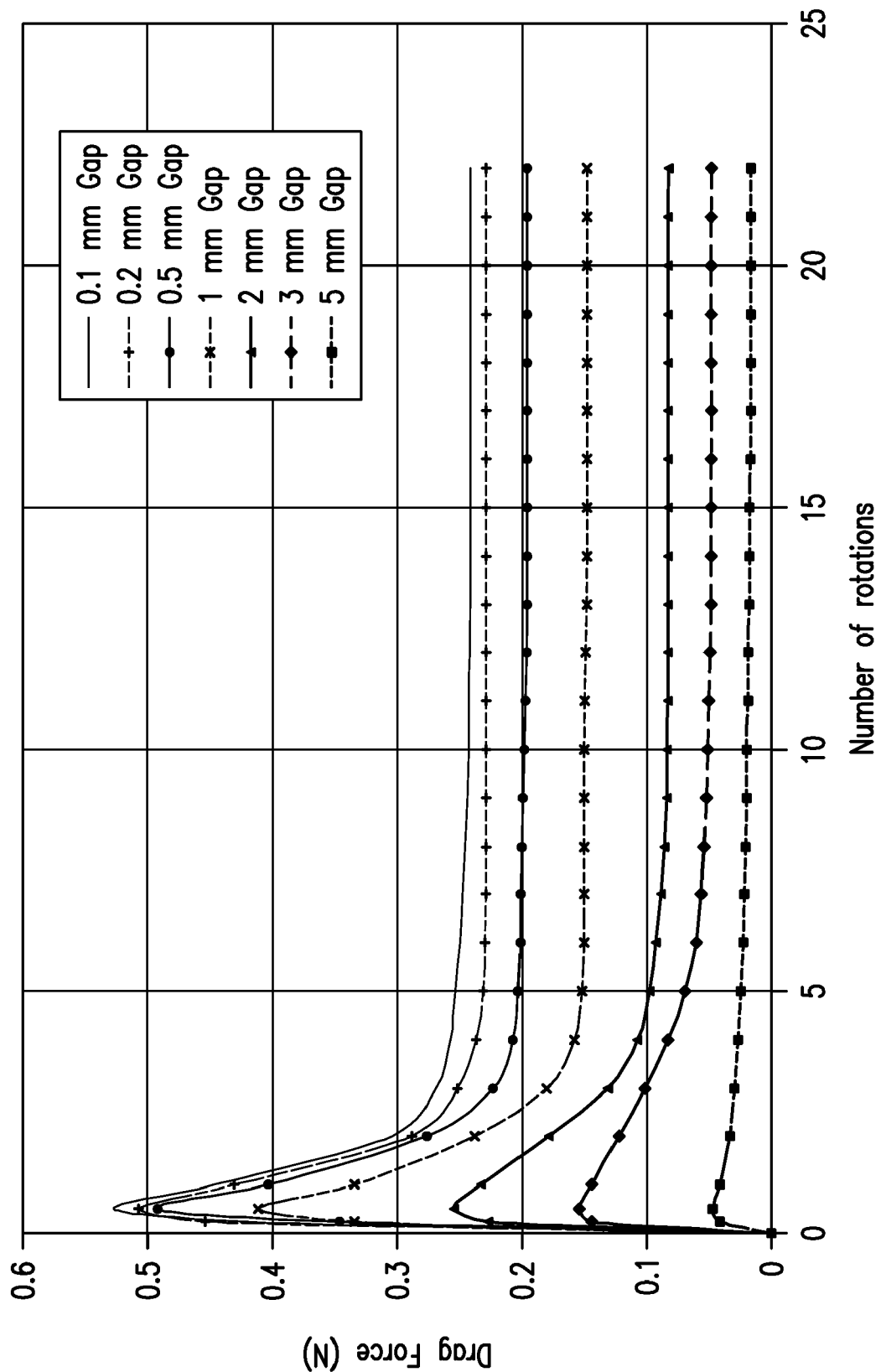
FIG. 6 shows variation of magnetic drag force with revolution count for various gaps between a rotating shaft and a magnetization magnet.
Figure 7:
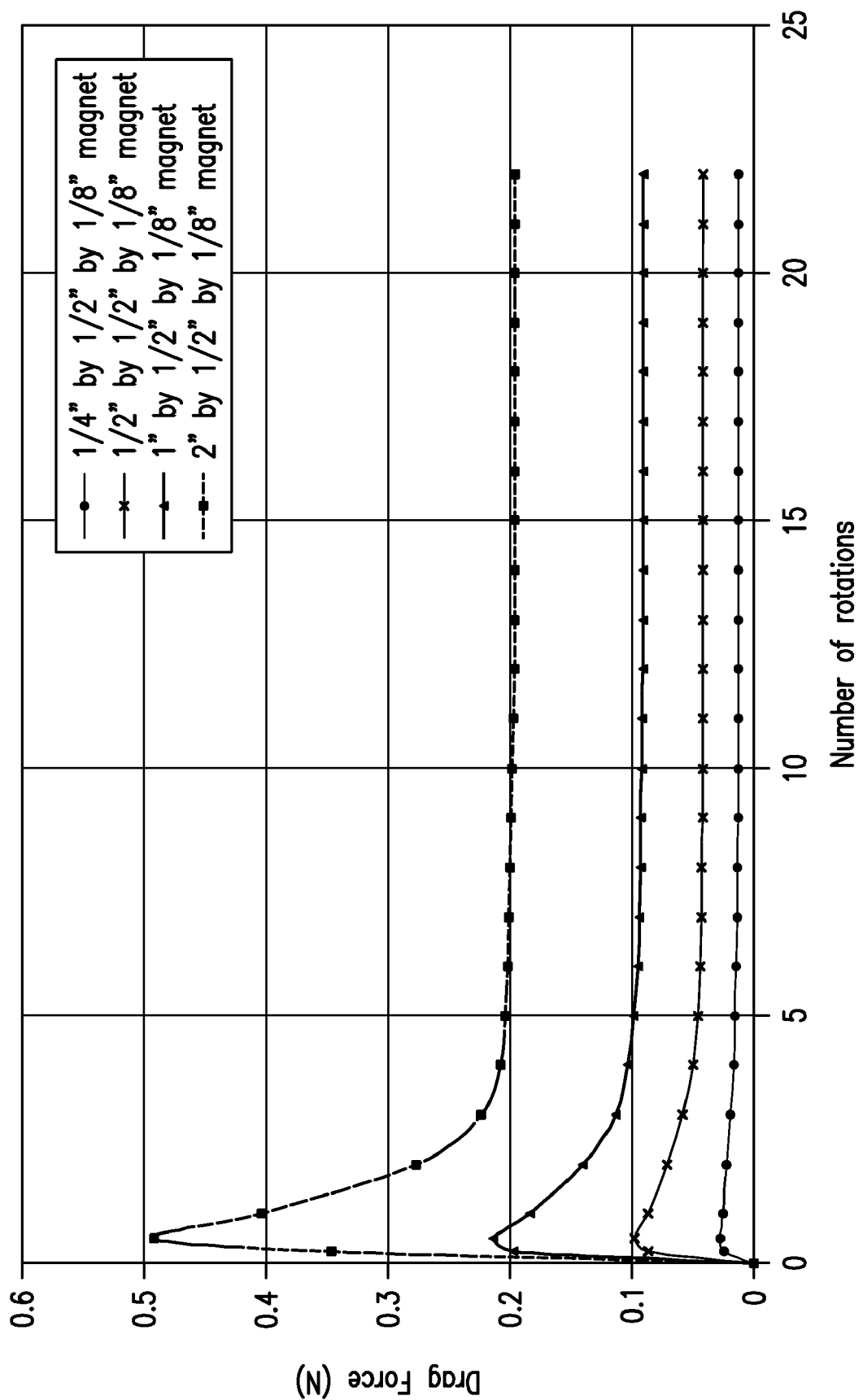
FIG. 7 shows variation of magnetic drag force with revolutions on a rotating shaft for various magnetization magnet widths, with the gap between the shaft and magnetization magnet being 0.5 mm.

FIGS. 6 and 7 illustrate how drag force changes with cumulative shaft rotation angle. In general, initial growth in the drag force results from the development of asymmetry in the distribution of M within the AZ, as shown in FIG. 4(b). As demonstrated by FIG. 3, the direction of H changes smoothly within the AZ, although M is delayed by the energetic impediments to domain wall motion and anisotropy. This asymmetry grows during rotation up to the angular width of the AZ, and perhaps somewhat beyond as the penetration depth of M increases. Thus, the drag force grows during this rotational period.

Figure 8A:
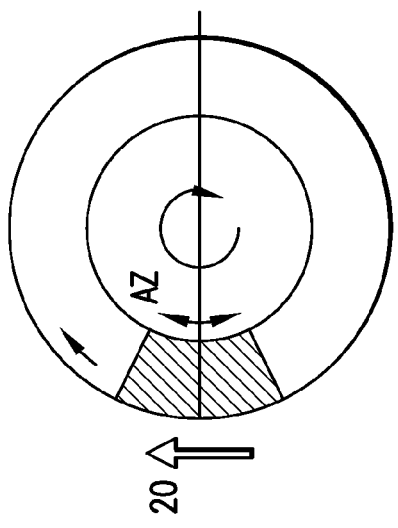
FIG. 8 shows the progression of changes in the circumferential magnetization within the "C" section outside the AZ brought about by continuous shaft rotation.
Figure 8B:
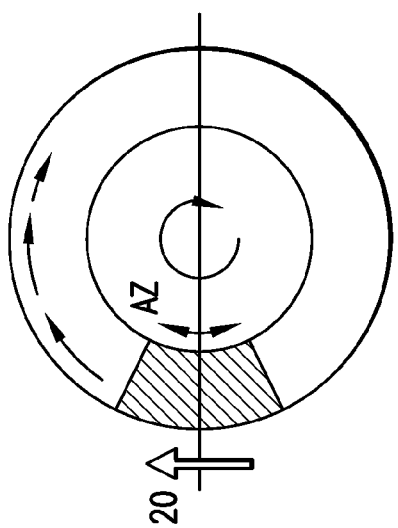
Figure 8C:
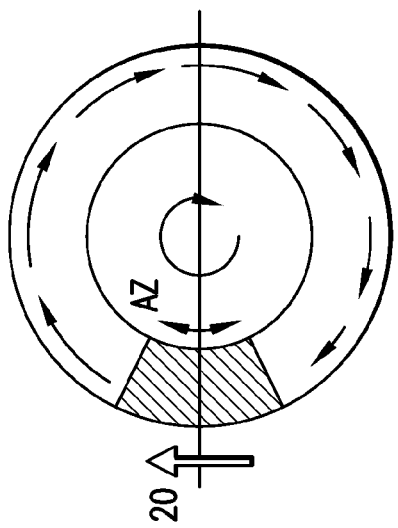

The demagnetizing field associated with the circumferential magnetization ($M_c$) that initially appears outside the AZ (see FIG. 8(a)) reduces the intensity of $M_c$. This field diminishes as the region expands circumferentially with further shaft rotation (see FIG. 8(b)). Eventually this circumferential, but non-uniform, magnetization extends around to the beginning of the AZ (see FIG. 8(c)). Ever less limited by its own demagnetization, $M_c$ grows in both intensity and uniformity during subsequent shaft rotations. The orientation distribution of the field within the AZ, previously determined solely by the magnet, is altered by a new and growing field, primarily in the $-H_{cir}$ direction, from this magnetized "C" section. The field in the AZ becomes more uniform and more uniformly directed. With the range of field excursion during passage through the AZ diminished, $E_h$ decreases. $W_h$, and hence $W_m$, T, and F, are all decreased. An equilibrium point is reached when, after a sufficient number of revolutions, the magnetization in the region just leaving the AZ becomes the same as that in the portion of the shaft just entering the AZ. In this manner stabilization of the drag force indicates the completion of the magnetization process.

Example 2, below, describes a representative device useful for measuring the drag force on a variety of ferromagnetic shafts being magnetized with variety of different magnets spaced at different distances from the shaft.

2. Magnetic Drag Force Sensing.

As described above, successful, complete magnetization of one or more polarized circumferential bands on a ferromagnetic shaft is indicated when the magnetic drag torque stabilizes. The inventors have further discovered that detecting changes in magnetic drag torque can be used in many applications. Accordingly, a patentable new class of sensors have been invented. In general, the sensors of the invention employ at least one measurement magnet and an operably associated sensing element used to detect force applied to the measurement magnet. Magnets and sensing element are described in the following sections.

A. Magnets

Any suitable electromagnet or permanent magnet can be used as a measurement magnet, although magnets that produce consistent, uniform magnetic fields of known strength are preferred. Particularly preferred permanent magnets are NdFeB magnets. Individual measurement magnets may be used, as may measurement magnet arrays. Suitable magnet arrays include segmented arrays, staggered arrays, and segmented, staggered arrays. As will be appreciated, the measurement magnets in a given array may be configured so that the surface area that they collectively sweep is less than the sum of the surface areas that is swept by each of them. Alternatively, the surface area collectively swept by the measurement magnets may be equivalent to or greater than the surface areas that are swept by each of them when considered individually.

The size, shape, and field strength of any measurement or reference magnet, or array of measurement or reference magnets, will vary depending upon the particular application. The design and selection of suitable magnets for a given application is well within the ordinary skill in the art.

B. Sensing Elements

The sensing element operably associated with a measurement magnet outputs a signal that is indicative of the magnetic drag force experienced by the measurement magnet upon exposure to a ferromagnetic sample in motion (or having previously been in motion) relative to the measurement magnet. As those in the art will appreciate, the task of measuring force resides primarily in sensor design, which can be resolved into two problems: geometric or physical constraints; and converting the force into a workable signal. As is known, an applied force can be measured many ways, including: by balancing the applied force against a standard mass through a system of levers; measuring the acceleration of a known mass and using Newton's second law; equalizing the applied force to a magnetic force generated by the interaction of a current-carrying coil and a magnet; distributing the applied force on a specific area to generate pressure, and then measuring the pressure; and converting the applied force into the deformation of an elastic element. Below several well-known types of force sensors useful for force-to-signal conversion are described. Any of these, as well as any other suitable now known or later developed force-to-signal measurement device, can be readily adapted for use in practicing this invention.

i. Strain Gauge Load Cells

In general, a strain gauge load cell comprises a metal wire structure that elastically deforms when subjected to a force. As a member is stressed, the resulting strain deforms the strain gauge that is bonded (e.g., by cement or epoxy) or otherwise securely attached to the member. The resistance of the metal wires changes as it undergoes strain, which change in resistance is used by a strain gauge load cell to produce an electrical signal proportional to the deformation of the member. Small loads are commonly measured by beam-type strain gage load cells. Ring-type load cells cover a wider range of loads.

ii. Piezoelectric Load Cells

When a force is exerted on certain crystalline materials (i.e., piezoelectric crystals), electric charges are formed on the crystal surface in proportion to that force. To make use of piezoelectric crystals, a charge amplifier is required to integrate the electric charges to give a signal that is proportional to the applied force and large enough to measure. Sensors based on piezoelectric crystals differ from most other sensing techniques in that they are active sensing elements. No power supply is needed, and the deformation to generate a signal is very small, which has the advantage of a high frequency response of the measuring system without introducing geometric changes to the force-measuring path.

iii. Capacitive Force Transducers

Transducers that use capacitance variation can also be applied to measure force. In such sensors, the force is directed onto a plane whose elastic deflection is detected by a variation of the capacitance. Highly sensitive force transducers can be constructed because capacitive transducers accurately sense very small deflections. An electric circuit converts the capacitance variations into dc-voltage variations.

iv. Force-Sensing Resistors (Conductive Polymers)

Force-sensing resistors utilize the fact that certain polymer thick-film devices exhibit decreasing resistance with the increase of an applied force. A force-sensing resistor is made up of two parts. The first is a resistive material applied to a film. The second is a set of digitating contacts applied to another film. The resistive material completes the electrical circuit between the two sets of conductors on the other film. When a force is applied to such a sensor, a better connection is made between the contacts; hence, the conductivity is increased.

v. Magnetoelastic Force Sensors

Magnetostrictive transducer devices operate based on the Joule effect, which states that a ferromagnetic material is dimensionally altered when subjected to a magnetic field. The effect is reversible and used in magnetoelastic force sensors: if an external force produces a strain in a magnetostrictive material, the material's magnetic state changes proportionally to the applied stress. An electric circuit converts these magnetic state changes to a voltage signal for subsequent processing.

vi. Torsional Balances

Balancing devices that utilize the deflection of a spring may also be used to determine forces. Torsional balances are equal arm scale force measuring devices. They are comprised of horizontal steel bands instead of pivots and bearings. The principle of operation is based on force application on one of the arms that will deflect the torsional spring in proportion to the applied force.

vii. Hydraulic Load Cells

A hydraulic load cell is a device filled with a liquid (usually oil) that has a pre-load pressure. Application of a force to the loading member increases the fluid pressure, which is detected by a pressure transducer.

viii. Pneumatic Load Cells

The operating principles of a pneumatic load cell are similar to those of hydraulic load cells. Again, a force is applied to one side of a piston or a diaphragm of flexible material and balanced by pneumatic pressure on the other side. This counteracting pressure is proportional to the applied force, and is detected by a pressure transducer.

C. Devices

The magnetic drag force sensors of the invention will most frequently be integrated into a complete device for measuring magnetic drag force, i.e., a magnetic drag force measurement device. In general, the magnetic drag force sensor(s) is positioned such that, in operation, the measurement magnet thereof is proximately spaced from a ferromagnetic sample capable of moving relative to the measurement magnet, such that the sensor, the sample, or both may be moved relative to one another during operation of the device. Signals output by the sensor are preferably conditioned by such suitable electronic circuitry as is required for the particular application, thus allowing it to be recorded, transmitted, and/or analyzed. In preferred embodiments, the signals are digitized into a form suitable for use by a processor configured to process them in order to determine a parameter of the magnetic drag force experienced by the measurement magnet. The results of the processing may be stored in a storage device and/or output to an output device (for example, a plotter, a computer monitor) interfaced with the device.

In order to move a magnetic drag force sensor and/or the ferromagnetic sample, a device according to the invention preferably includes a drive system adapted for the particular application. Moreover, for some applications (e.g., measurement of hysteresis loss), it is desirable to sufficiently magnetize the sample, preferably by placing it in a state of known remnant magnetization, prior to moving the sample relative to the magnetic drag force sensor. This may be accomplished through the use of one or more magnets positioned upstream of the measurement magnet(s) of magnetic drag force sensor. Alternatively, the sample may first be exposed to the measurement magnet in a non-sensing mode in order to establish the desired state of remanent magnetization. Thereafter, the sample can be moved relative to the magnetic drag force sensor so that the drag force can be measured. It will also be appreciated that a magnetic drag force may also be detected after stopping the relative motion of the magnetic drag force sensor and sample.

In addition, or alternatively, a device of the invention may also include one or more magnets, including one or more measurement magnets disposed in one or more magnetic drag force sensors, positioned such that upon exposure to a sample, at least one measurement magnet is proximately spaced from a first surface of the sample and a second measurement magnet is proximately spaced from a second, different surface of the sample. For example, in a device wherein the sample horizontally moves through the device, one measurement magnet is positioned above and is proximately spaced from the upper surface of the sample, whereas the other measurement magnet is positioned below and is proximately spaced from the lower surface of the sample.

A device according to the invention can be adapted for detecting and/or measuring (qualitatively, semi-quantitatively, or quantitatively) magnetic drag forces in conjunction with ferromagnetic samples of any shape, size, or composition. Representative sample shapes include plates, bars, strips, wires, and cables. In cross-section, such samples may, for example, have a geometric shape selected from the group consisting of a circle, an ovoid shape, and a polygon (e.g., a triangle, rectangle, square, etc.). In many embodiments, the device will be configured to analyze ferromagnetic samples of substantially uniform geometric cross-section, while in other embodiments, the devices will be configured to adapt to different sample sizes, shapes, etc. Samples may be separate pieces, or they may be one continuous piece.

Figure 9:
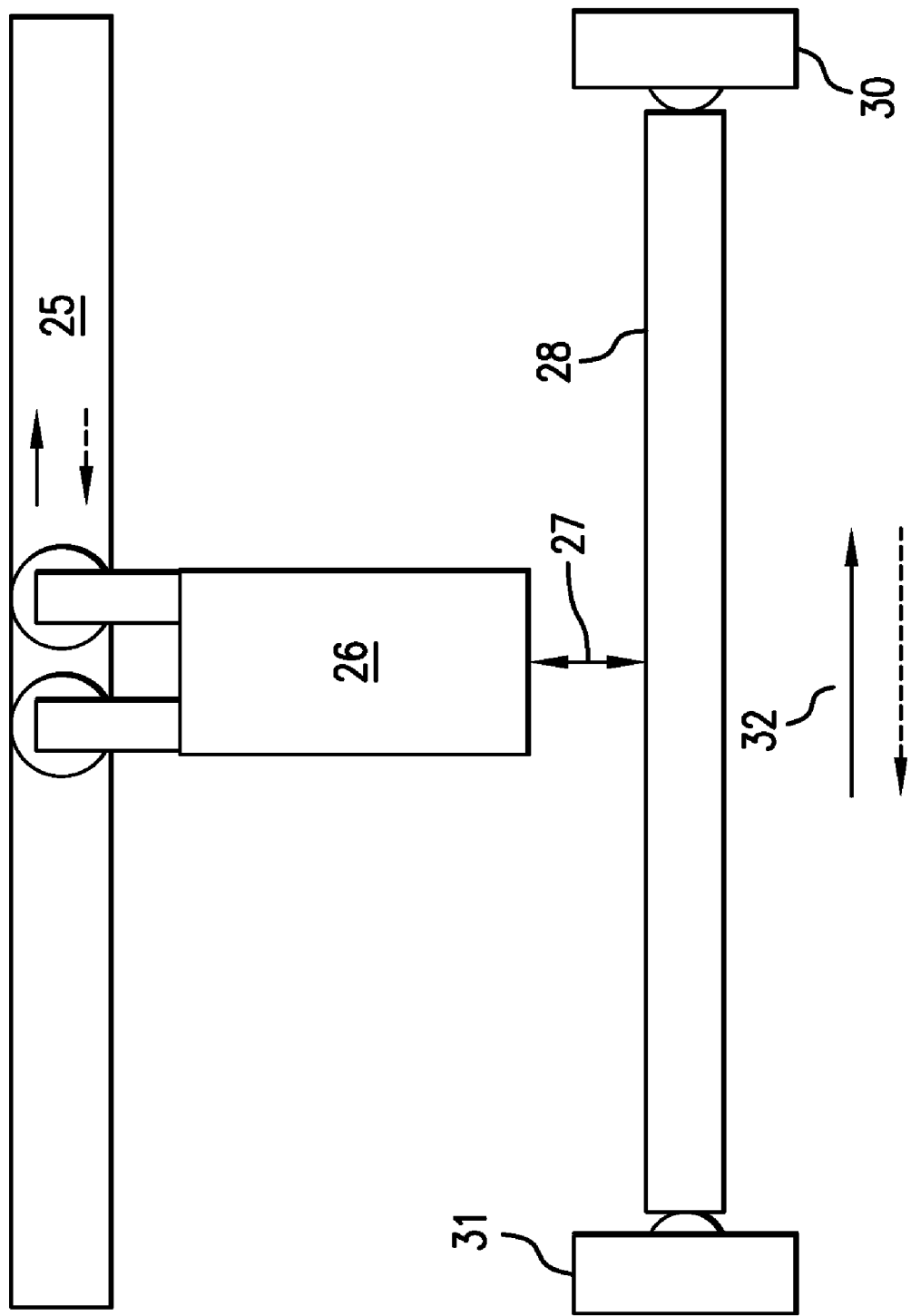
FIG. 9 schematically represents a device wherein magnetic drag force is measured using one or more force sensing elements operably associated with a ferromagnetic sample resting on a sample stage (not shown).

While devices according to the invention have largely been described as comprising magnetic drag force sensors that include at least one measurement magnet operably associated with a sensing element, it will also be appreciated that magnetic drag forces can also be measured from their effects on the sample, particularly small samples. In such embodiments, the device typically comprises a sample stage, or platform, upon which a ferromagnetic sample can be placed. One or more sensing elements are positioned so that they are operably associated with the sample stage. As with the other embodiments of the invention where a sensing element is operably associated with a measurement magnet, here, the sensing element also outputs signals indicative of a magnetic drag force, the difference being that drag force is experienced by the ferromagnetic sample upon exposure to a pre-determined magnetic field generated by one or more reference magnets (or a reference magnet array) proximately spaced from the ferromagnetic sample. In some embodiments, the reference magnet (or reference magnet array) may be movable in relation to the sample stage (see FIG. 9, sample stage not shown), for example, by placement of the reference magnet PM (26) on a carriage that allows controlled movement of the reference magnet (or reference magnet array). As shown in FIG. 9, movement (25) of the reference magnet (26) about a carriage causes the sample (28) to experience a drag force (32), which can be sensed by the sensing elements (force sensor elements 30 and 31). The sample stage (not shown) is preferably made of a material that is non-magnetic. Similar embodiments, in which the reference magnet remains stationary and the sample stage is moved at a uniform speed, are also envisioned.

3. Applications for Magnetic Drag Force Sensing.

Figure 10:
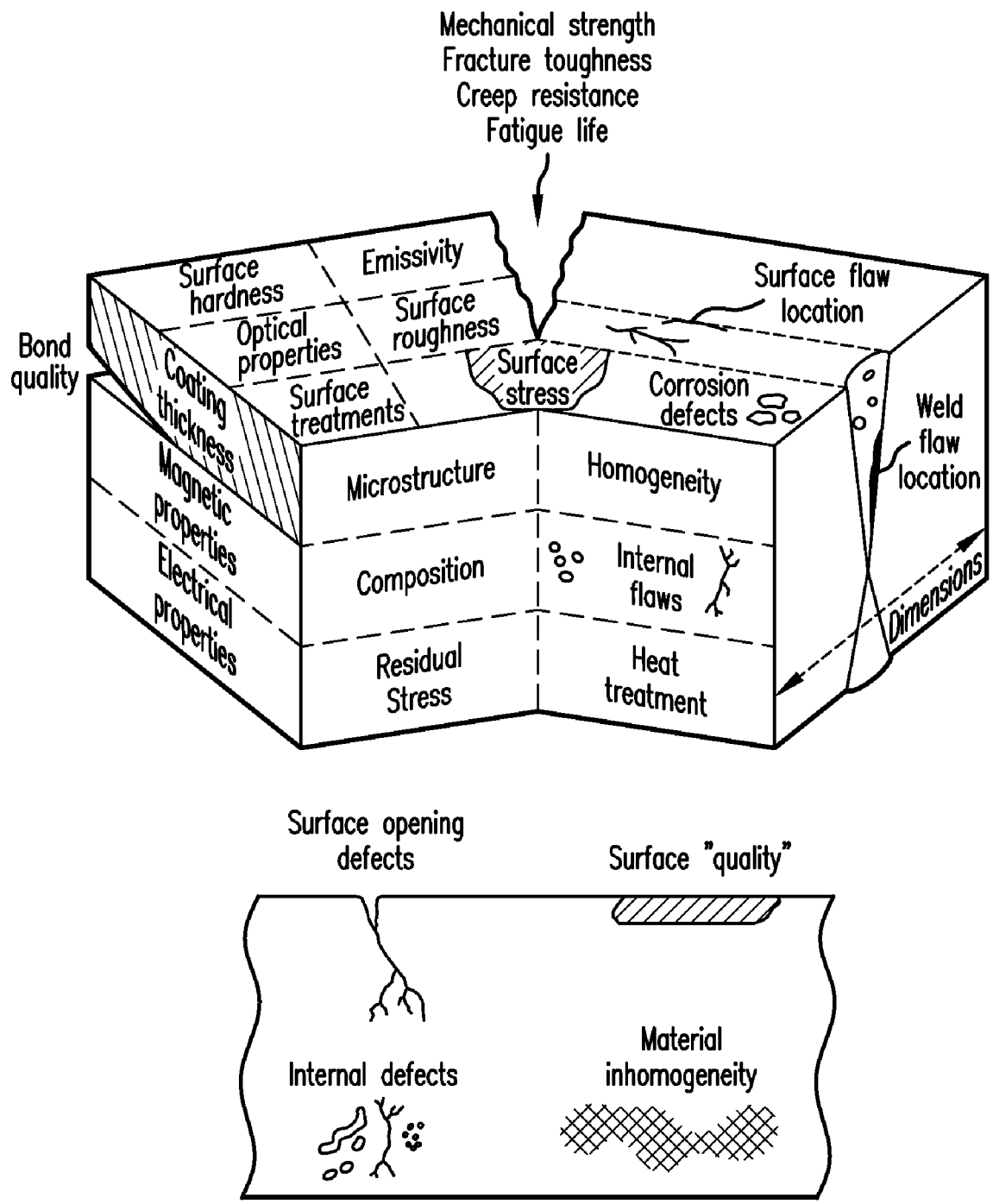
FIG. 10, panel A, shows preferred areas in which the sensors and devices of the invention can be used for evaluation. Panel B shows some of the various flaws and defects that can be detected in certain materials (e.g., sheets of ferromagnetic material) using the sensors and devices described herein.

NDE is typically incorporated into manufacturing processes in one of four primary ways: to provide quality control during manufacture or fabrication; to ensure that an item conforms to established specifications; to examine plant, equipment, or components during service, in order to meet regulatory requirements or to check for evidence of wear or premature failure; or as a diagnostic tool in research and development. FIG. 10 illustrates some of the numerous applications for the instant magnetic drag force sensors. For example, the magnetic drag force sensors and devices of the invention can be used to measure hysteresis losses, thickness of material, material composition and/or microstructure, inhomogeneity or other defects (e.g., internal flaws, surface scratches, etc.) in samples, and correlated mechanical properties (e.g., hardness, strength, etc.). Such sensors and devices may also be used to determine a material's orientation (for example, by detecting the presence of non-visible features) and for identification purposes (for example, by detecting a coded arrangement of non-visible features). As will be the case for other applications, the particular context in which the method is to be performed determines the ultimate configuration of the device to be employed, although in each case they will be used to sense a detectable drag force parameter, such as a steady state, time rate of change of the drag force, etc.

As will be appreciated by those in the art, an important application of the sensors and devices of the invention is in the context of measuring hysteresis losses in ferromagnetic materials, particular electrical steels. Several general device configurations are schematically shown in FIG. 11. Similar devices employing a single measurement magnet are described in detail in Example 1, below. In general, these devices employ at least one magnetic drag force sensor positioned near the surface of a ferromagnetic sample to be tested. The sensor comprises one or more measurement magnets spaced slightly from sample.

In these embodiments, the measurement magnet(s) is(are) operably associated with a force sensing element (e.g., a load cell) such that a drag force, or changes in the drag force, experienced by the measurement magnet(s) can be measured during or after the sensor and sample move in relation to each other. Preferably, the sample is magnetized (i.e., "initialized") before encountering the measurement magnet(s). Initialization ensures that the ferromagnetic sample enters the active zone (AZ) of the measurement magnet(s) in the desired state of magnetization. For hysteresis loss measurement, the sample should enter the AZ of the measurement magnet(s) remanently magnetized with a polarity relative to the first encountered field of the measurement magnet(s), which depends on which loop area is to be measured. In particular, it has been discovered that by positioning the measurement magnet(s) such that its(their) magnetic moment(s) is(are) normal to the direction of sample travel, the device can be used for the measurement of the hysteresis loss associated with a major hysteresis loop. On the other hand, by positioning the measurement magnet(s) such that its(their) magnetic moment(s) is(are) parallel to the direction of sample travel, the device can be used for the measurement of the hysteresis losses associated with the combination of the major and minor hysteresis loops. Thus, if desired, the contribution of the minor hysteresis loop can be determined by using two measurement magnets, preferably one having its magnetic moment oriented parallel to the sample's direction of travel, the other, normal to the sample's direction of travel.

Now, with reference to FIG. 11(b), to measure a major loop area only using a device having an upstream magnet (UM; 37) and a measurement magnet (MM; 35) disposed facing the same surface (but different locations at any given instant) of the sample (SUT; 36), both UM and MM will have their magnetic moments normal to the direction of motion and to the sample surface. The UM and MM have the same polarity orientation. As the leading edge of the SUT (presumed to have not been previously magnetized, but its magnetic state is not significant in any event) enters the AZ of the UM, it is subjected first to an increasingly intense field of one polarity, followed by a decrease in intensity and, after crossing zero, to an increasing field of the opposite polarity, followed by a decrease towards zero as it recedes from the AZ. The SUT thus leaves the AZ of the UM in a remanent magnetic state. As the leading edge of the SUT (and all subsequent points) enters the AZ of the MM, it first encounters an increasingly intense field of opposite polarity to its remanence. Its remanent magnetization is first reduced by this field (reaching zero at the coercive field), then increased in intensity until reaching technical saturation at the peak intensity of this field. During further motion, it passes through the region of decreasing field intensity, with the magnetization continuously relaxing, reaching remanence at zero field. During further motion, points on the SUT experience an increasingly intense field of opposite polarity. Again the magnetization is first reduced, again crossing zero at the coercive field and rising to technical saturation of opposite polarity at the peak field intensity. During further motion, points on the SUT experience a continuous reduction in field intensity approaching zero as they leave the AZ. Since the magnetization at each affected point in the SUT started from remanence and ends at remanence of the same polarity, having been subjected to saturation of each polarity, it has traversed a single major hysteresis loop. The net drag force on the measurement magnet is thus equal to the product of the area of this loop and the cross sectional area of the SUT.

Again with reference to FIG. 11(d), the use of one or more magnets (CUM (39) and CMM (38)) positioned below the SUT (36) and opposite the corresponding magnet(s) (37 and 35, respectively) disposed proximate to the opposite surface of the SUT, can provide compensating attractive forces. If used, the drag force on the CMM may also be measured and added to the drag force measured on the MM. Alternatively, the MM and CMM may be physically connected to the same force measurement system. As will be appreciated, embodiments that reduce the attractive force between measurement and/or upstream magnets and the sample being tested may simplify the magnet support system and prevent distortion of thin SUTs. Such configurations will also reduce the intensity of field components normal to the direction of motion, thereby more nearly reproducing the uniaxial fields used in conventional hysteresis loss measurement systems.

As shown in FIG. 11 and as described herein, one or more upstream magnets (UM and CUM, 37 and 39, respectively) may be employed to "initialize" a ferromagnetic sample, i.e., place it into a desired state of remanent magnetization. Of course, initialization can also be achieved by bidirectional motion of the sample in relation to the measurement magnet. The magnetic moment of the measurement magnet will preferably be disposed parallel or normal, depending upon application, to the direction of motion of the sample, and combinations of measurement magnets wherein the magnetic moment of one is oriented normal to, and another is oriented such that its magnetic moment is oriented parallel to, the sample's direction of motion, can also be used. Similarly, one or more magnets placed on opposite sides of the sample can serve to reduce or eliminate the attractive force.

Another series of applications for the sensors and devices of the invention is in the context of detecting inhomogeneity and defects in ferromagnetic materials for various shapes and sizes, from small strips of materials to large plates, wires, cables, bars, etc. These methods may be applied during manufacturing processes, or in the field, for example, to test for wear and fatigue of structurally critical components.

As will be appreciated, one or more markers that disrupt the homogeneity of some portion of a ferromagnetic material may be intentionally introduced in order to provide a "signature" that enables the material to be identified, its orientation to be determined, etc. Such markers can be introduced into a sample, for example, by heat-treating small areas of the sample at specific locations, preferably in a specific pattern that can later be detected in a signal obtained by measuring magnetic drag force in at least the region(s) where the marker was earlier introduced. Other methods of introducing markers include shot peening, etching, scratching, or otherwise scoring a surface, forming one or more holes or cavities in the material, introducing an inhomogeneity into one or more specific locations in a material during the manufacturing process (e.g., by emplacing materials having chemical compositions or properties that differ from the material from which the sample is otherwise formed), etc. Indeed, any method suitable for the introduction of a flaw or defect that locally alters a magnetic property of the material can be used for this purpose.

Yet another application for this instant invention is the context of monitoring manufacturing processes, even in real time. For example, by monitoring magnetic drag force during a production process, material homogeneity can be assessed, as can material quality. In addition, the instant invention can be used to monitor whether a particular production process, or portions thereof, is functioning properly. For example, if a ferromagnetic material produced by a rolling, stamping, or other forming process is required to have a certain degree of surface smoothness, for example, use of a device according to the invention can be used to monitor that metric (here, degree of surface smoothness), and also to detect, for example, when a roller upstream of the drag force measurement sensor may be damaged or worn, whether some portion of the stamping surface of a tool has become damaged or worn, etc.

EXAMPLES

The following Examples are provided to illustrate certain aspects, embodiments, and applications of the present invention, and to aid those of skill in the art in practicing the invention. These Examples are in no way to be considered to limit the scope of the invention in any manner.

Example 1

Detecting Magnetic Drag Force Using a Single Measurement Magnet

This example describes one preferred embodiment of the invention. In this embodiment the force resisting the motion of a ferromagnetic member through the intense field close to a permanent magnet is measured by the equal and opposite reaction force on the permanent magnet. This force tends to "drag" the magnet in the direction of motion of the ferromagnetic member.

Figure 13B:
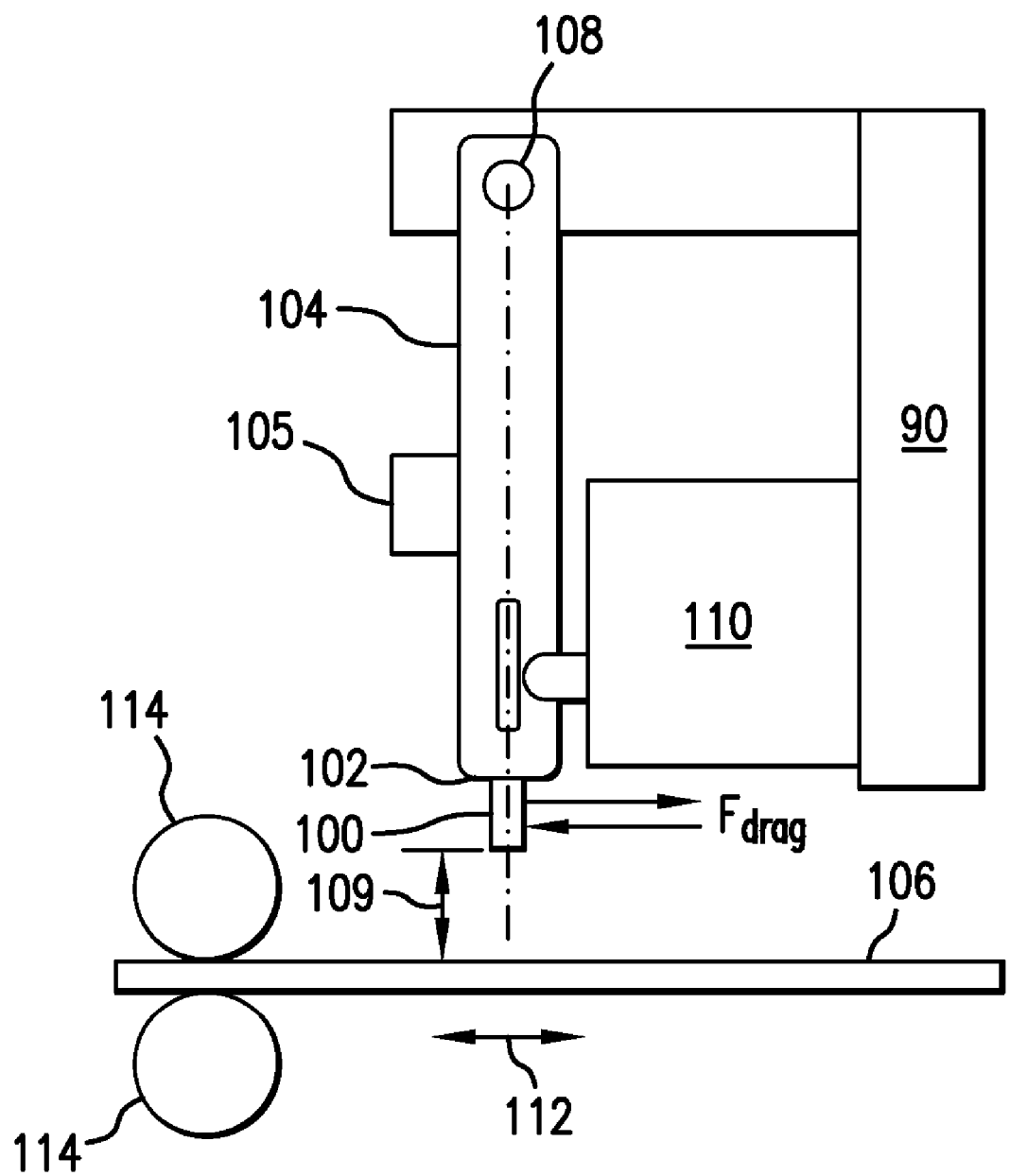

Photographs of apparatus incorporating this embodiment is shown in FIGS. 12(a) and (b). The essential features are depicted in the schematic diagram of FIGS. 13(a) and (b). As illustrated in FIG. 13(b), the drag force measuring device (90) employs a single permanent magnet (PM; 100) suspended at the distal end (102) of a pendulum (104) which can rotate freely about shaft (108). The pendulum is biased to bear slightly against the load cell (110) in the absence of any drag (tangential) force on the magnet. This bias prevents the pendulum from losing contact with the load cell. The output signal of the load cell is generally fed through a cable to a meter, recorder, and/or data acquisition system (not shown), as required. The ferromagnetic sample under test, SUT, here shown as a strip (106), is maintained at a fixed distance (109) from the magnet by guides (not shown). The SUT (106) is driven in the directions shown (112) by any suitable means, here shown as rollers (114).

The actual value of drag force is determined as one-half the difference between the output forces measured while the strip (106) moves first in one direction, then the other. In this way, there is no need to know the actual value of the deliberately applied bias force, nor do any unknown biasing influences affect the measurement accuracy.

A typical plot of the output signal from the load cell as a cold rolled steel strip sample (25.5 mm wide, 1.63 mm thick and 300 mm long) was moved first in one direction, then, after a brief pause, in the other direction, is shown in FIG. 14. The speed of motion of the SUT for this plot was approximately 4 mm/s. The dimensions of the measurement magnet were 50.8 mm by 12.7 mm by 3.175 mm, and the magnetic moment was assumed to be approximately 1920 ergs/gauss.

While the instantaneous drag force shows variations associated with the imperfect homogeneity of the sample, the remarkable symmetry of those portions of the plot (FIG. 14) corresponding to each direction of motion of the SUT is immediately apparent. Thus features A, B, C, D, E, and F on the left side of the pause region (501) are seen to have excellent correspondence with features A', B', C', D', E', and F', respectively, on the right side of the pause region. The drag force computed as one-half the vertical displacement of corresponding features seen on the two sides of the pause region is found to be closely the same for all such features. In common practice, wherein such plots are made by sampling and digitizing the signal from the load cell, the computed average value of load cell signal at all samples between salient features, such as A and F, is subtracted from a similarly obtained average for all samples between corresponding features, such as A' and F'. The drag force is found simply as one-half of the difference between these averages.

Example 2

Apparatus for Measuring Magnetic Drag Force on Rotating Ferromagnetic Shafts

Figure 5:
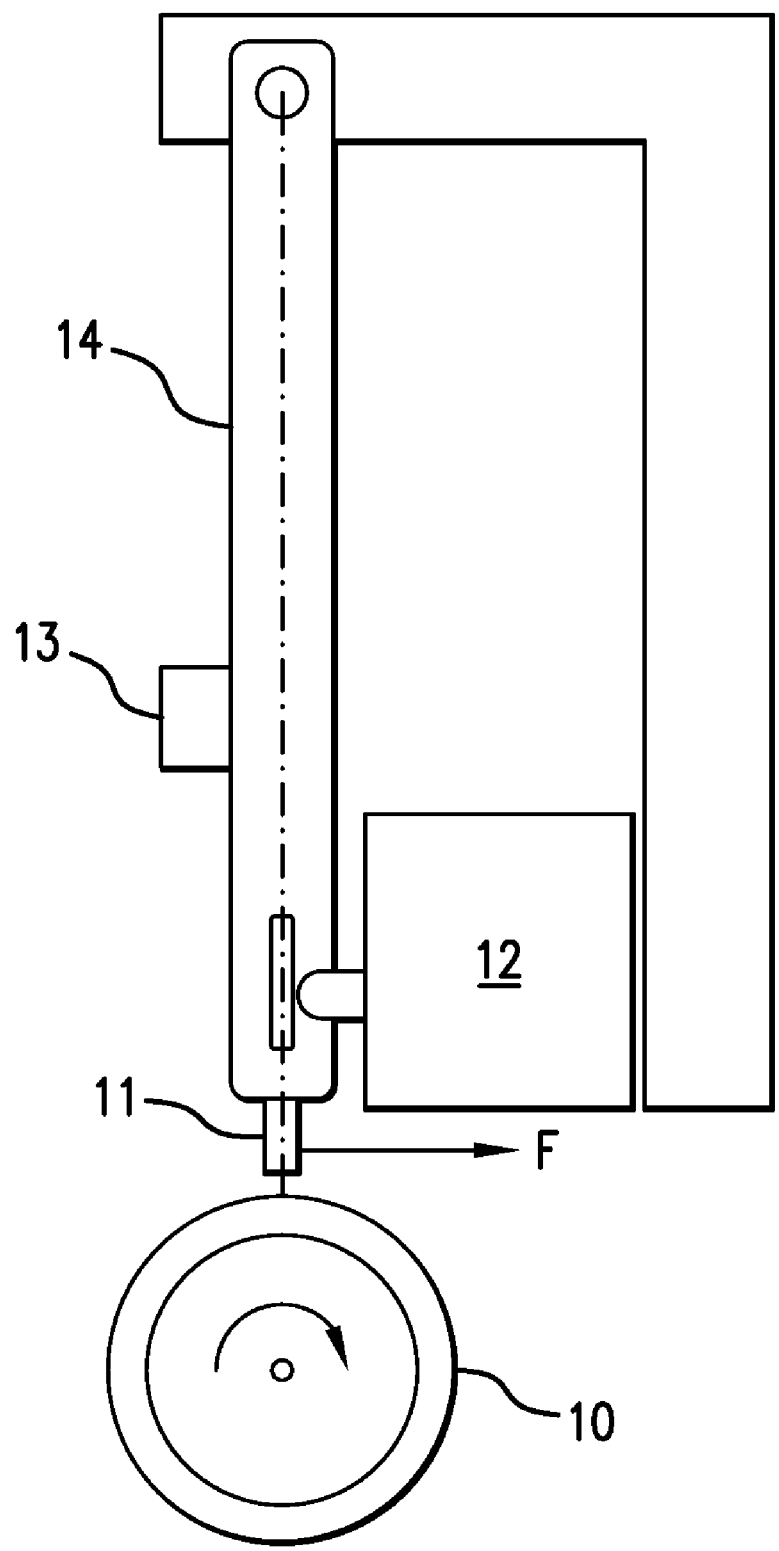
FIG. 5 shows a schematic diagram of the experimental apparatus described in Example 2. The magnet is attached to the end of a pendulum supported by instrument bearings in the frame. The bias torque supplied by the offset weight allows measurement of drag forces in either direction.

This example describes a preferred embodiment of the invention that relates a rotating ferromagnetic shaft. A schematic diagram of the apparatus is illustrated in FIG. 5. The shaft was made out of 300M steel (0.43% C, 1.8% Ni, 1.6% Si, 0.8% Cr, 0.4% Mo, 0.07% V, Bal Fe) with an outside radius, R, of 17.5 mm and a wall thickness, t, of 2.5 mm. The coercive force of the material is ±39 Oe. The measurement magnet was of NdFeB type with an energy product of 38MGO, and had dimensions of 2 in. by 0.5 in. by 0.125 in. The load cell was manufactured by Futek (model L2338). The shaft was rotated at slow speed (16.6 rpm) by coupling to a synchronous gear head motor and at high speed (2000 rpm) with a variable speed motor using an O-ring belt.

Measured values of the drag force for the first 22 revolutions of the shaft (characterized in FIG. 5) are shown in FIG. 6 for a variety of gaps between the magnet and the shaft surface. A similar plot for a variety of magnet sizes is shown in FIG. 7. In this embodiment, a polarizing magnet experiences a reaction force that is equal in amplitude to the drag force on a ferromagnetic shaft being magnetized. Such an apparatus can measure this force using a wide range of shaft sizes.

As the data in FIG. 6 shows, the drag force develops during the early part of the first revolution, reaches a peak before the end of that revolution, and diminishes thereafter to a stable value within 5-10 complete shaft revolutions. Thus, drag force measurement can be employed to determine when in this process for instilling a circumferentially magnetized band within a shaft that magnetization has reached a stable value. The data also demonstrates that the drag force stabilizes sooner and at higher values with smaller gaps between the magnetization magnet and the shaft.

FIG. 7 also shows that the limiting value of drag force increases somewhat more quickly than magnet width, reflecting the greater average field intensity developed by wider magnets. At rotational speeds of greater than about 40 rpm, the final drag force values started to grow continuously with increasing speed, an expected consequence of eddy currents.

Example 3

Determining Hysteresis Loss by Measuring Drag Force Using a Single Measurement Magnet 1. Abstract.

This example describes another preferred embodiment, wherein a magnetic drag force measurement device according to the invention (as schematically illustrated in FIG. 15) is used to measure hysteresis loss in a ferromagnetic strip. Thus, this example also describes novel methods for determining hysteresis losses, particularly in thin strips of soft magnetic materials. These methods are based on the measurement of a drag force that arises with movement of a thin sample strip through the strong field existing in the space near a measurement magnet (here, a permanent magnet). Not associated with macro eddy currents, the drag force is shown to originate from the magnetic hysteresis of the material, having in fact an amplitude equal to the product of hysteresis loss and the area of the sample cross section. Correlation within 18% with measurements made by conventional methods is shown for a wide range of experimental materials.

2. Introduction.

Hysteresis loss is a defining characteristic of electrical steels, and strongly influences the energy efficiency and functionality of the products in which such materials are used. Hysteresis loss varies greatly with the elemental composition of the particular steel, the thermal and mechanical fabrication processes used to produce the steel, and the direction of magnetization (Dupre, et al. (2000), J. Magn. Mag. Mat., vol. 215, p. 112). Hysteresis loss measurement, therefore, is routinely practiced both during the development of such materials and to ensure the consistent quality of finished products.

Although varying significantly in detail (see De Wulf, et al. (2003), J. Appl. Phys., vol. 93, p. 8543; De Wulf, et al. (2000), J. Appl. Phys., vol. 89, p. 5239), conventional methods determine hysteresis loss from the enclosed area of a sample's B-H loop. This is typically obtained by concurrent measurements of an applied field, H, slowly varying between desired limits, and the resulting induction, B, in a sample of known cross sectional area, A. In contrast, the method described in this example, while also requiring knowledge of A, depends only on the measurement of a mechanical force. As will be shown, this method, in addition to its applicability to standard strip samples, offers an opportunity for the continuous measurement of hysteresis loss, in real time, during the manufacture of product in wire, strip, sheet, and even bar form.

3. Theory.

In using a device as schematically illustrated in FIG. 15, the specimen under test, or SUT (130), is maintained at a small, fixed distance (135), from a magnetic dipole of moment, m, typically a permanent measurement magnet, PM (132). Both the SUT (130) and the PM (132) are constrained to disallow the mutual attractive force, $F_a$, to bring them into contact. The SUT (130) is made to move in a direction parallel to m at some convenient, not necessarily constant, velocity, but slowly enough to avoid the corrupting influence of eddy currents. As described herein, a "drag" force, $F_d$ (134), originating from the magnetic hysteresis of the material, resists the motion of the SUT. Since the SUT may be large, is in motion, and is subjected to a variety of associated forces, the measurement of $F_d$ is more conveniently made by its reaction on the measurement magnet, PM (132), which therefore is supported in such manner as to both rigidly resist $F_a$ and provide for the measurement of $F_d$. Of course, other device configurations are also possible for measuring this drag force, including measuring the drag force on the sample under test.

To simplify the analytical treatment, PM is assumed to be a single dipole. Also, the SUT, though having a finite cross sectional area, A, is assumed to have negligible dimensions normal to m and, in the plane of its surface facing PM, normal to the direction of motion. By thus implying that the distance to the dipole is large compared to these SUT dimensions, the intensity of the dipole field, H, at points within the SUT effectively varies only with longitudinal position of the SUT in relation to PM. The SUT is also assumed to extend far enough in both longitudinal directions so that its ends are situated in regions of vanishingly small H. Although H includes components normal to m, the shape anisotropy of the SUT limits the effects of these components on the magnetization orientation. It is nevertheless recognized that $F_a$ derives from the normal component of magnetization. Thus, the longitudinal component of H, and the history of exposure to this component, are the significant determinants of the intensity and polarity of the local magnetization, M, within the SUT. Following from Cullity's derivation (B. D. Cullity, *Introduction to Magnetic Materials* (Addison-Wesley, Reading, Mass., 1972) p. 614), H at a point P within the SUT, at a distance Gx from the central location of m, is readily shown to be:

$$H = \frac{m}{G^3(1+x^2)^{3/2}} \left( \frac{3x^2}{1+x^2} + 1 \right)^{1/2}, \quad (9a)$$

directed at an angle, $\beta = \tan^{-1}(0.5/x) + \tan^{-1}(1/x)$, to m. Its longitudinal component is then found from $$H_L = H\cos\beta = \frac{H(x^2 - 0.5)}{(x^4 + 1.25x^2 + 0.25)^{1/2}}. \quad (9b)$$

Equations (9a) and (9b) show $H_L$ to depend only on m, G and the normalized distance, x, to P. FIG. 16 shows $H_L$, normalized against its maximum value at x=0, plotted against x. Several features of this plot should be noted. First, $H_L$ is symmetrical around x. Second, the peak negative $H_L$ is 20.2% of its peak positive value, $H_{p+}$, and occurs at 1.225 G. Third, $H_L$ crosses zero at x=0.707 G. Fourth, $H_L$ at x=±6 G is than about 0.01 of its peak value; thus, significant changes in M are limited to locations between about plus or minus 5 G, the active zone (AZ) in this device.

The SUT is assumed to have arrived at the position shown in FIG. 15 by motion from left to right, and that in so doing, at least the portion shown, passed under a second, identical PM (PM2—not shown), also separated from the SUT by G, and located greater than 12 G upstream (in the device illustrated in FIG. 15, to the left of PM) of the permanent measurement magnet. An element of material of infinitesimal length, dx, at position 1 in FIG. 16a, while presently located where the fields from both permanent magnets (PM1 and PM2) are near zero, will previously have been exposed to the peak negative field, $H_{p-}$, from PM2, assumed to be sufficient to result in technical saturation. Thus, when reaching position 1, the start of the AZ, this element of material will be at negative remanence, $-M_r$, indicated as point 1 on the hysteresis loop in FIG. 16b, and transcribed to a plot of M vs. x in FIG. 16c. During further rightward motion of the SUT, a distance sufficient for the element originally at 1 to arrive at 2, the location of $H_{p-}$, M within this element will grow along the path indicated 1→2 in FIG. 16b and 16c. During further motion to the right, $H_L$ falls to zero and M returns to $-M_r$ along path 2→3 (FIG. 16(a), 16(b), and 16(c)), thereby completing the traversal of a minor hysteresis loop. The continuously moving element then experiences a steep growth in $H_L$ of opposite polarity, reaching $H_{p+}$ at 4, relaxing to zero at 5, a growth to $H_{p-}$ at 6, and again approaching zero at 7, the end of the AZ. If moved slowly enough for quasistatic conditions to prevail, M within the element follows these field variations, reaching positive saturation at point 4, $+M_r$ at point 5, negative saturation at point 6, and returns to its starting value of $-M_r$ at point 7, thereby completing traversal of a major hysteresis loop.

Figure 16A:
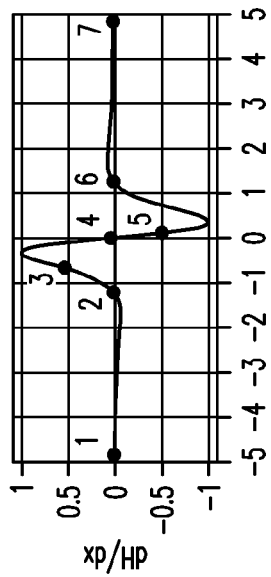
Figure 16B:
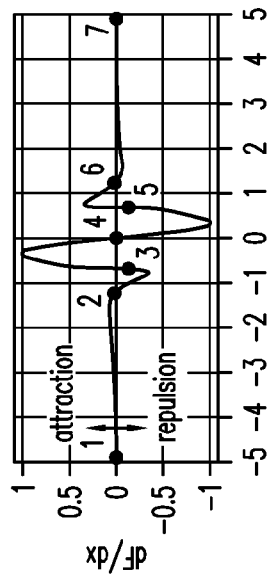
Figure 16C:
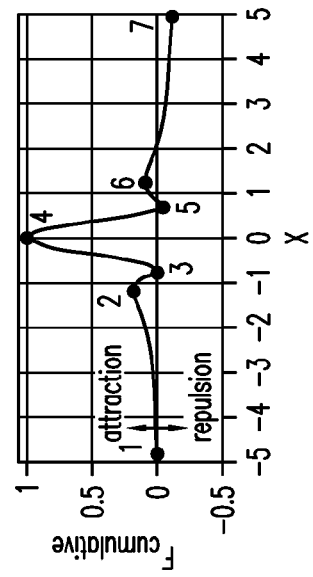
Figure 16D:
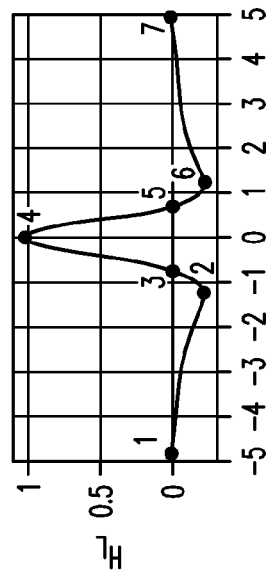
Figure 16E:
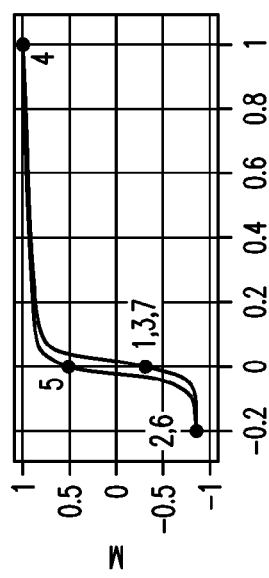

At each position within AZ, the sample has a magnetic moment, MAdx, and by virtue of the field gradient, dH/dx at that location, it experiences a longitudinal force dF=MAdxdH/dx. Variation in dH/dx with position is shown in FIG. 16d, and variation in dF (plotted as dF/dx) is shown in FIG. 16e. Since, at any one instant, there are elements of like size at every location in the AZ, the sum of these elemental forces comprises a net force acting on the sample, which can be described as:

$$F = \int dF = \int MAdx \frac{dH}{dx} = A \int M dH \quad (10)$$

Figure 16F:
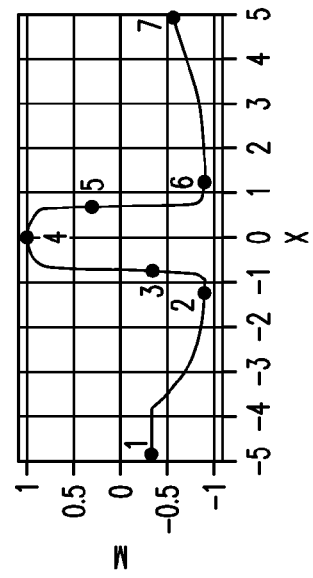

Since the AZ contains elements having magnetizations representative of traversal of both the minor loop 1→2→3 and the major loop 3→4→5→6→7, F in equation (10) clearly derives from the total area of both loops. FIG. 16f shows the cumulative sum of the elemental forces to the left of each point within the AZ. The existence of a finite final sum, F, clearly shown in FIG. 16f, reflects the asymmetry of the plots in FIGS. 16(c) and 16(e,) asymmetries that arise from the hysteretic M-H functions of the sample material. F is seen to be a repulsive force, acting to resist the motion of the sample. The reaction on the measurement magnet is in the opposite direction, tending to drag it along in the direction of the motion, hence its appropriate appellation, "drag force", $F_d$.

4. Experiments.

Both drag force and conventional hysteresis loss measurements were performed on strip samples, 25 mm wide and 280 mm long, of materials characterized in Table 1.

TABLE 1

Identification of materials tested, together with measurement results and correlation assessment.

| ID | Material | Condition | Thickness | Major | Minor | Minor/Major | Major + Minor | By $F_d$ | Diff. % |
|----|----------|-----------|-----------|-------|-------|-------------|---------------|----------|---------|
| A | Black Nickel | As Rec'd | 0.254 mm | 992.8 J/m³ | 80.6 J/m³ | 8.11% | 1073.4 J/m³ | 1037.0 J/m³ | −3.4 |
| B | AISI1010 Steel | Cold Rolled | 0.127 | 5450.4 | 698.0 | 12.81 | 6148.4 | 6336.2 | 3.1 |
| C | AISI1010 Steel | Annealed | 0.125 | 1450.1 | 285.2 | 19.67 | 1735.3 | 1952.3 | 12.5 |
| D | AISI1010 Steel | Cold Rolled | 0.254 | 6317.3 | 492.1 | 7.79 | 6809.4 | 6798.6 | −0.2 |
| E | AISI1010 Steel | Annealed | 0.250 | 1240.1 | 59.7 | 4.81 | 1299.8 | 1324.9 | 1.9 |
| F | AISI1010 Steel | Cold Rolled | 0.381 | 6745.1 | 744.8 | 11.04 | 7489.9 | 7137.0 | −4.7 |
| G | AISI1010 Steel | Annealed | 0.370 | 1439.8 | 198.2 | 13.77 | 1638.0 | 1393.6 | −14.9 |
| X | FeSi NO | | 0.500 | 505.5 | 124.7 | 24.67 | 630.2 | 518.2 | −17.8 |
| Y | FeSi GO 75 deg | | 0.235 | 372.4 | 173.3 | 46.54 | 545.7 | 531.9 | −2.5 |
| Z | FeSi GO 0 deg | | 0.288 | 155.3 | 39.2 | 25.24 | 194.5 | 199.5 | 2.6 |

The magnetic drag force measurement device used to conduct these experiments was essentially the same device as described in Example 1. Also, the device was modified to hold the sample strip at fixed distances ranging from between 0.25 mm and 5.1 mm under the pendulum mounted measured magnet, and it was equipped with a small gear head motor and driving rollers that allowed the sample strip to be moved in either horizontal direction at speeds ranging from 1.6 to 7 mm/s. The measurement magnet was a 50.8 mm long (and thus extended well beyond the edges of the narrower sample strips), 12.7 mm wide (normal to the strip surface), and 3.17 mm thick (longitudinal).

In operation, the samples were first moved back and forth such that the central 250 mm of each 280 mm strip passed once in each direction under the measurement magnet. This ensured that all portions of a strip not in the AZ were placed in the (negative) remanent state without the need for a second magnet upstream of the measurement magnet. Each sample strip was then positioned to allow the central 80 mm to pass once in each direction under the measurement magnet while the horizontal force on the magnet was measured and recorded. Forward and reverse motions were used to eliminate the effect of possible components of the attractive force due to imperfect parallelism between m and the direction of sample strip motion. The pendulum was biased to always exert a force in one direction on the load cell; $F_d$ then being taken as 0.5× the difference between the average forces measured in each direction. Limiting the measurements to a relatively small central region of the SUT prevented its ends from getting close enough to the measurement magnet to develop significant parasitic forces.

Quasistatic hysteresis loss associated with both major and minor loops was measured in a double yoke, small size single sheet tester (SST)(De Wulf, et al. (2003), J. Magn. Magn. Mat., vol. 254, p. 70) using a current mode excitation with a constant dH/dt of 1 (kA/m)/s. Major and minor B-H loops for the 3 Si-steel samples are shown in FIG. 17, with similar loops for the blackened nickel and a low carbon steel, in both cold-rolled and annealed conditions, shown in FIG. 18. The results of both conventional and magnetic drag force measurements are listed in Table 1, above.

FIG. 19 shows the effect of varying the spacing between measurement magnet and the various sample strips. As these results show, the magnetic drag force initially increases with decreasing gap for all of the test specimens, with all except strip Z reaching limiting values near 1 mm gaps. The data scatter seen for this sample strip suggests that the accurate measurement of very low drag forces (about 1.1 mN) may be beyond the capability of the load cell (5 N range) utilized.

5. Discussion.

Hysteresis losses determined by magnetic drag force measurement was seen to match within 18% those determined by a conventional method. This unexpectedly close correlation for materials having a wide range of magnetic and geometric characteristics indicates that neither normal field components nor the demagnetizing fields arising from the large values of dM/dx (FIG. 16©) existing within some portions of the active zone have significant effects. The sluggish dependence on gap was also not unexpected, since peak field excursions of just a few times the coercivity are usually sufficient to develop the major portion of major loop areas. These encouraging results demonstrate the utility of this approach for assessing hysteresis losses in electrical steels. While the use of a single measurement magnet oriented with its magnetic moment parallel to the direction of strip travel in the device allows a determination of hysteresis losses attributable to the combination of both the major and minor hysteresis loops, use of a separate device having a second magnetic drag force sensor having its measurement magnet, equivalent to the first in terms of field strength, dimensions, etc. but oriented normal to the direction of sample travel (from which losses attributable to major hysteresis loop only, with only negligible contributions from the minor loop), will allow the hysteresis losses attributable to each of the major and minor loops to be separated and accurately determined, if desired. Alternatively, other embodiments, for example, those that include measurement magnets placed on both sides of the sample, preferably opposite one another (see FIG. 11) will substantially reduce the normal force and allow this method to be applied to thicker samples.

Example 4

Portable Device for Measuring Magnetic Drag Force

This example provides a description of a preferred embodiment of the invention that can be used, for example, to detect defects in large plates. See FIG. 20. This device (150) is a small three-wheeled (152) machine that can be propelled manually by pushing on the handles (154). The magnetic drag force sensor is housed within a cavity (157) in the body of the device (150). The magnetic drag force sensor has a pendulum (159) that holds a measurement magnet (156), which is disposed at the bottom end of the pendulum (159). Two sensing elements (170) engage the pendulum (159), which can pivot about a shaft (160). As this device is moved at a uniform speed across a large ferromagnetic surface (e.g., a submarine hull), changes in the magnetic drag force can be sensed.

Example 5

Device for Measuring Magnetic Drag Force in conjunction with Moving Cables

This example provides a description of a preferred embodiment of the invention that can be used, for example, to detect flaws in a cable, for example, a ski-lift cable. See FIG. 21. In this embodiment, the cable (180) passes through a stationary magnetic drag force sensor (182) that comprises a ring magnet (184) operably associated with two force sensing elements (186, 188). As the cable moves through the magnetic drag force sensor, flaws in the cable can be detected in real-time.

Example 6

Detection of Hidden Flaws Using Drag Force Measurements

This example describes the ability of the sensors and devices of the invention to detect hidden flaws in a ferromagnetic sample. These results are illustrated in FIGS. 22, 23, and 24. FIG. 22 shows a strip of low carbon steel in which various "defects" were purposefully instilled. The figure shows the dimensions of the strip and the locations and dimensions of three drilled holes (193, 194, and 195) and three abrasively cut slots (191, 192, and 196). The holes went completely through the strip, while the slots had a maximum depth of 0.30 mm (80%) of the strip thickness. FIG. 23 shows a plot of the drag force against time (hence of position along the strip), as the strip was moved first in one direction, and then, after a small pause (197), in the reverse direction, between a pair of identical measurement magnets (while held at a small constant distance below a measurement magnet) mounted in the previously described apparatus. The variation in drag force with position clearly shows both the relative size and location of the instilled defects (191-196). The portions of the plot on the left side of the paused region are seen to closely mirror those on the right side of this region, with the variations in drag force on each side clearly reflecting the defects instilled in the strip. Depending on the direction of motion, the magnitude of the drag force associated with each defect is seen to have a sharp decrease (or increase) followed by a similarly sharp increase (or decrease). These changes in drag force are believed to arise from the magnetic poles that form at the longitudinal extremes of each defect in response to the inhomogeneous magnetization existing between the bulk of the strip and the regions within the defects where the material is absent. Depending on the pole orientation of the measurement magnet, either a north or south pole will form at one end of the defect and an opposite pole will form at the other. The repulsive force between the upstream pole of the measurement magnet and the approaching pole from the defect is the source of the first occurring drag force peak and the repulsive force between the downstream pole of the measurement magnet and the receding pole from the defect is the source of the second occurring peak. The vertical displacement of the two regions of the plot shown in FIG. 23 is indicative of the magnetic hysteresis loss of the strip being tested.

Subsequently, two strips, neither having any deliberately instilled defects and each having the same nominal length and width dimensions and having been cut from the same sheet of material as the original strip, were cemented, one on each side of the defect-containing strip. FIG. 24 shows the drag force plot for this "stack" of strips when tested in the same apparatus, and in the same manner as the previously described defect-containing strip. Although the actual defects in the center strip of this stack were no longer visible, their readily identifiable signatures (191-196) are clearly seen in the drag force plot of the stack.

Data collected from comparisons of the peak amplitudes and other features of the drag force signature of well characterized defects instilled in standardized test strips with the resultant signatures when such strips are "buried" at known depths from the surface of stacks of reasonably flawless strips will enable determinations to be made of the type, size and depth of hidden flaws in bulk materials. Scanning the surface of the part to be examined with described combinations of measurement magnets, force sensors and supplementary magnets, together with processors to capture, process and store both the output signals from the force sensors and signals indicative of the corresponding location on the surface of the part, can thus provide a simple and economical means for the nondestructive detection of the presence of structural or compositional anomalies within the part being examined.

All of the articles and methods disclosed and claimed herein can be made and executed without undue experimentation in light of the present disclosure. While the articles and methods of this invention have been described in terms of preferred embodiments, it will be apparent to those of skill in the art that variations may be applied to the articles and methods without departing from the spirit and scope of the invention. All such variations and equivalents apparent to those skilled in the art, whether now existing or later developed, are deemed to be within the spirit and scope of the invention as defined by the appended claims.

All patents, patent applications, and publications mentioned in the specification are indicative of the levels of those of ordinary skill in the art to which the invention pertains. All patents, patent applications, and publications are herein incorporated by reference in their entirety for all purposes and to the same extent as if each individual publication was specifically and individually indicated to be incorporated by reference in its entirety for any and all purposes.

The invention illustratively described herein suitably may be practiced in the absence of any element(s) not specifically disclosed herein. Thus, for example, in each instance herein any of the terms "comprising", "consisting essentially of", and "consisting of" may be replaced with either of the other two terms. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A magnetic drag force sensor comprising:
   a. a measurement magnet having a magnetic field; and
   b. a sensing element operably associated with the measurement magnet, wherein the sensing element outputs a signal indicative of a magnetic drag force experienced by the measurement magnet when interacting with magnetization in a ferromagnetic sample previously or then in relative motion to the measurement magnet, wherein the measurement magnet is positioned proximate to but spaced from the ferromagnetic sample in manner that (i) resists a mutual attractive force between the measurement magnet and the ferromagneic sample and (ii) allows interaction between the magnetic field of the measurement magnet and magnetization in the ferromagnetic sample.

2. A magnetic drag force sensor according to claim 1 wherein the measurement magnet is selected from the group consisting of an electromagnet and a permanent magnet.

3. A magnetic drag force sensor according to claim 1 wherein the sensing element senses physical displacement of the measurement magnet in response to the magnetic drag force.

4. A magnetic drag force sensor according to claim 1 wherein the sensing element senses pressure applied to the measurement magnet in response to the magnetic drag force.

5. A magnetic drag force measurement device, comprising at least one magnetic drag force sensor according to claim 1, and a processor configured to process signals from the sensing element to determine a parameter of the magnetic drag force experienced by the measurement magnet.

6. A magnetic drag force measurement device according to claim 5 further comprising a drive for moving a ferromagnetic sample past the measurement magnet.

7. A magnetic drag force measurement device according to claim 5 further comprising an upstream magnet to achieve sufficient magnetization of a ferromagnetic sample upon association of the ferromagnetic sample with the device.

8. A magnetic drag force measurement device according to claim 5 configured to measure magnetic drag force, wherein the ferromagnetic sample is selected from the group consisting of a ferromagnetic strip, ferromagnetic bar, a ferromagnetic plate, a ferromagnetic wire, and a ferromagnetic cable.

9. A magnetic drag force measurement device according to claim 5 that comprises first and second magnetic drag force sensors, wherein each of the first and second magnetic drag force sensors is a magnetic drag force sensor that comprises:
 a. a measurement magnet having a magnetic field; and
 b. a sensing element operably associated with the measurement magnet, wherein the sensing element outputs a signal indicative of a magnetic drag force experienced by the measurement magnet when interacting with magnetization in a ferromagnetic sample previously or then in relative motion to the measurement magnet, wherein the measurement magnet is positioned proximate to but spaced from the ferromagnetic sample in manner that (i) resists a mutual attractive force between the measurement magnet and the ferromagnetic sample and (ii) allows interaction between the magnetic field of the measurement magnet and magnetization in the ferromagnetic sample.

10. A magnetic drag force measurement device according to claim 9 wherein the first magnetic drag force sensor is proximately spaced from one surface of the ferromagnetic sample and the second magnetic drag force sensor is proximately spaced from a second surface of the ferromagnetic sample.

11. A magnetic drag force measurement device according to claim 10 wherein the first magnetic drag force sensor is disposed substantially opposite the second magnetic drag force sensor.

12. A magnetic drag force measurement device according to claim 5 that comprises a plurality of magnetic drag force sensors spaced concentrically about an opening through which a ferromagnetic sample of substantially uniform geometric cross-section can be passed, wherein each of the magnetic drag force sensors comprises:
 a. a measurement magnet having a magnetic field; and
 b. a sensing element operably associated with the measurement magnet, wherein the sensing element outputs a signal indicative of a magnetic drag force experienced by the measurement magnet when interacting with magnetization in a ferromagnetic sample previously or then in relative motion to the measurement magnet, wherein the measurement magnet is positioned proximate to but spaced from the ferromagnetic sample in manner that (i) resists a mutual attractive force between the measurement magnet and the ferromagnetic sample and (ii) allows interaction between the magnetic field of the measurement magnet and magnetization in the ferromagnetic sample.

13. A magnetic drag force measurement device according to claim 12 wherein the geometric cross-section of the ferromagnetic sample is selected from the group consisting of a circle, an ovoid shape, and a polygon.

14. A magnetic drag force measurement device according to claim 5 that comprises a plurality of magnetic drag force sensors, wherein each of the magnetic drag force sensors comprises:
 a. a measurement magnet having a magnetic field; and
 b. a sensing element operably associated with the measurement magnet, wherein the sensing element outputs a signal indicative of a magnetic drag force experienced by the measurement magnet when interacting with magnetization in a ferromagnetic sample previously or then in relative motion to the measurement magnet, wherein the measurement magnet is positioned proximate to but spaced from the ferromagnetic sample in manner that (i) resists a mutual attractive force between the measurement magnet and the ferromagnetic sample and (ii) allows interaction between the magnetic field of the measurement magnet and magnetization in the ferromagnetic sample.

15. A magnetic drag force measurement device according to claim 14 wherein the magnetic drag force sensors are disposed in an array selected from the group consisting of a staggered sensor array, a segmented sensor array, and a staggered, segmented sensor array.

16. A magnetic drag force measurement device according to claim 15 wherein a sample surface area that can be swept by the measurement magnets of the array is less than the sum of the surface areas that can be swept by each of the measurement magnets of the magnetic drag force sensors in the array.

17. A method for measuring magnetic drag force, comprising:
 a. moving a ferromagnetic sample relative to a magnetic drag force measurement device according to claim 5; and
 b. measuring the magnetic drag force experienced by the measurement magnet as a result of relative motion between the ferromagnetic sample and the measurement magnet.

18. A method according to claim 17 wherein the measurement of the magnetic drag force allows evaluation of the ferromagnetic sample's identity, quality, or position, or position of an inhomogeneity within the ferromagnetic sample.

19. A method according to claim 17 wherein the ferromagnetic sample is magnetized prior to passage past the measurement magnet.

20. A magnetic drag force measurement device, comprising:
   a. a sample stage adapted to support a ferromagnetic sample; and
   b. a magnetic drag force sensor operably associated with the sample stage, wherein the magnetic drag force sensor comprises:
      (i) a measurement magnet having a magnetic field; and
      (ii) a sensing element operably associated with the measurement magnet, wherein the sensing element outputs a signal indicative of a magnetic drag force experienced by the measurement magnet when interacting with magnetization in a ferromagnetic sample previously or then in relative motion to the measurement magnet, wherein the measurement magnet is positioned proximate to but spaced from the ferromagnetic sample in manner that (i) resists a mutual attractive force between the measurement magnet and the ferromagnetic sample and (ii) allows interaction between the magnetic field of the measurement magnet and magnetization in the ferromagnetic sample.

21. A magnetic drag force measurement device according to claim 20 further comprising a processor configured to process signals from the sensing element to determine a parameter of the magnetic drag force.

22. A magnetic drag force measure device according to claim 20 further comprising a drive to create relative motion between the measurement magnet and the ferromagnetic sample.

* * * * *